US011019352B2

(12) United States Patent
George et al.

(10) Patent No.: US 11,019,352 B2
(45) Date of Patent: *May 25, 2021

(54) SAMPLE ARRAY CODING FOR LOW-DELAY

(71) Applicant: GE VIDEO COMPRESSION, LLC, Albany, NY (US)

(72) Inventors: Valeri George, Berlin (DE); Anastasia Henkel, Berlin (DE); Heiner Kirchhoffer, Berlin (DE); Detlev Marpe, Berlin (DE); Thomas Schierl, Berlin (DE)

(73) Assignee: GE Video Compression, LLC, Albany, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/987,955

(22) Filed: Aug. 7, 2020

(65) Prior Publication Data

US 2020/0366919 A1 Nov. 19, 2020

Related U.S. Application Data

(63) Continuation of application No. 16/840,043, filed on Apr. 3, 2020, now Pat. No. 10,771,800, which is a
(Continued)

(51) Int. Cl.
*H04N 11/02* (2006.01)
*H04N 19/44* (2014.01)
(Continued)

(52) U.S. Cl.
CPC .......... *H04N 19/44* (2014.11); *H03M 7/3071* (2013.01); *H04N 19/13* (2014.11);
(Continued)

(58) Field of Classification Search
CPC .................................................... H04N 19/44
(Continued)

(56) References Cited

U.S. PATENT DOCUMENTS 6,104,752 A * 8/2000 Yamagishi ....... H04N 21/44004
375/240
7,365,659 B1 4/2008 Hoffmann et al.
(Continued)

FOREIGN PATENT DOCUMENTS

AU 2012285851 B2 1/2013
AU 2016200182 B2 2/2016
(Continued)

OTHER PUBLICATIONS

Clare, Gordon et al., "Wavefront and Cabac flush: Different Degress of Parallelism Without Transcoding", Joint Collaborative Team on Video Coding (JCT-VC) of ITU-T SG16 WP3 and ISO/IEC JTC1/SC29/WG11, 6th Meeting, Torino, Jul. 2011, Document JCTVC-F275, 11 pages.
(Continued)

*Primary Examiner* — Leron Beck
(74) *Attorney, Agent, or Firm* — Morgan, Lewis & Bockius LLP

(57) ABSTRACT

The entropy coding of a current part of a predetermined entropy slice is based on, not only, the respective probability estimations of the predetermined entropy slice as adapted using the previously coded part of the predetermined entropy slice, but also probability estimations as used in the entropy coding of a spatially neighboring, in entropy slice order preceding entropy slice at a neighboring part thereof. Thereby, the probability estimations used in entropy coding are adapted to the actual symbol statistics more closely, thereby lowering the coding efficiency decrease normally caused by lower-delay concepts. Temporal interrelationships are exploited additionally or alternatively.

30 Claims, 18 Drawing Sheets

Related U.S. Application Data continuation of application No. 16/578,716, filed on Sep. 23, 2019, now Pat. No. 10,652,564, which is a continuation of application No. 16/109,874, filed on Aug. 23, 2018, now Pat. No. 10,659,798, which is a continuation of application No. 15/824,196, filed on Nov. 28, 2017, now Pat. No. 10,085,035, which is a continuation of application No. 15/639,312, filed on Jun. 30, 2017, now Pat. No. 9,860,547, which is a continuation of application No. 15/414,356, filed on Jan. 24, 2017, now Pat. No. 9,729,891, which is a continuation of application No. 14/141,374, filed on Dec. 26, 2013, now Pat. No. 9,596,469, which is a continuation of application No. PCT/EP2012/063929, filed on Jul. 16, 2012.

(60) Provisional application No. 61/508,477, filed on Jul. 15, 2011.

(51) Int. Cl.
| | |
|---|---|
| *H03M 7/30* | (2006.01) |
| *H04N 19/13* | (2014.01) |
| *H04N 19/503* | (2014.01) |
| *H04N 19/91* | (2014.01) |
| *H04N 19/436* | (2014.01) |
| *H04N 19/167* | (2014.01) |
| *H04N 19/174* | (2014.01) |
| *H04N 19/51* | (2014.01) |
| *H03M 7/40* | (2006.01) |

(52) U.S. Cl.
CPC ......... *H04N 19/167* (2014.11); *H04N 19/174* (2014.11); *H04N 19/436* (2014.11); *H04N 19/503* (2014.11); *H04N 19/51* (2014.11); *H04N 19/91* (2014.11); *H03M 7/4037* (2013.01)

(58) Field of Classification Search
USPC ........................................ 375/240.01–240.29
See application file for complete search history.

(56) References Cited

U.S. PATENT DOCUMENTS

| | | | |
|---|---|---|---|
| 7,460,042 B2 | 12/2008 | Oshikiri et al. | |
| 7,693,339 B2 | 4/2010 | Wittenstein | |
| 8,111,749 B2* | 2/2012 | Muller | H04N 19/436 375/240.1 |
| 8,344,917 B2 | 1/2013 | Misra | |
| 9,467,699 B2 | 10/2016 | Huang et al. | |
| 9,596,469 B2 | 3/2017 | George et al. | |
| 2003/0189982 A1* | 10/2003 | MacInnis | H04N 19/61 375/240.24 |
| 2004/0258162 A1* | 12/2004 | Gordon | H04N 19/436 375/240.25 |
| 2005/0089233 A1* | 4/2005 | Malvar | G06T 9/005 382/238 |
| 2007/0014367 A1* | 1/2007 | Zhou | H04N 19/44 375/240.23 |
| 2007/0223580 A1* | 9/2007 | Ye | H04N 19/174 375/240.12 |
| 2008/0001796 A1* | 1/2008 | Oshikiri | H04N 19/61 341/107 |
| 2008/0013633 A1 | 1/2008 | Ye | |
| 2008/0219349 A1* | 9/2008 | Huang | H04N 19/436 375/240.15 |
| 2009/0002379 A1 | 1/2009 | Baeza et al. | |
| 2009/0175331 A1 | 7/2009 | Karczewicz | |
| 2009/0196355 A1 | 8/2009 | Kao et al. | |
| 2009/0245383 A1* | 10/2009 | Mizutani | H04N 19/42 375/240.24 |
| 2010/0092098 A1 | 4/2010 | Schonberg | |
| 2010/0098155 A1* | 4/2010 | Demircin | H04N 19/61 375/240.02 |
| 2011/0280314 A1* | 11/2011 | Sankaran | H04N 19/42 375/240.25 |
| 2012/0328003 A1 | 12/2012 | Chien | |
| 2013/0003823 A1* | 1/2013 | Misra | H04N 19/91 375/240.02 |

FOREIGN PATENT DOCUMENTS

| | | |
|---|---|---|
| CA | 2841888 | 1/2017 |
| CN | 101800898 A | 8/2010 |
| CN | 103797793 A | 5/2014 |
| EP | 2146343 A1 | 1/2010 |
| EP | 2732625 B1 | 9/2018 |
| FR | 2931280 A1 | 11/2009 |
| JP | 2008011204 A | 1/2008 |
| JP | 6177775 B2 | 7/2017 |
| KR | 10-2187171 B1 | 12/2020 |
| RU | 2093957 C1 | 10/1997 |
| WO | 03058945 A2 | 7/2003 |
| WO | 2009049250 A2 | 4/2009 |
| WO | 2009119888 A1 | 10/2009 |
| WO | 2011042645 A1 | 4/2011 |
| WO | 2011052142 A1 | 5/2011 |
| WO | 2012172113 A1 | 12/2012 |

OTHER PUBLICATIONS

Henry, Felix et al., "Wavefront Parallel Processing", 96 MOEG Meeting, 21-25-3-2011 Geneva.

Decision to Grant dated Nov. 10, 2016 issued in Ukranian Patent Application a201512071.

Notice of Allowance dated Aug. 31, 2017 in U.S. Appl. No. 15/639,259.

Notice of Allowance dated Aug. 28, 2017 in U.S. Appl. No. 15/639,312.

Decision to Grant dated Sep. 25, 2017 in Russian Application 2016137910.

Non-final Office Action dated Feb. 26, 2018 in U.S. Appl. No. 15/824,196.

Notice of Allowance U.S. Appl. No. 15/824,196 dated May 23, 2018.

Extended European Search Report EP Application No. 18190116.6 dated Oct. 26, 2018.

Office Action Korean Application No. 10-2018-7021274 dated Nov. 19, 2018.

Henry F. et al., "Wavefront Parallel Processing", JCT-VC of ITU-T and ISO/IEC, JCTVC-E196 ver.4, Mar. 19, 2011, pp. 1-9.

Office Action Chinese Patent Application No. 201711438957 dated Jan. 4, 2019.

Office Action Chinese Patent Application No. 201711438960 dated Jan. 2, 2019.

Non-final Office Action U.S. Appl. No. 16/109,874 dated Jan. 25, 2019.

D. Marpe et al., Context-Based Adaptive Binary Arithmetic Coding in the H.264/AVC Video Compressed Standard, IEEE Transactions on Circuits, vol. 13, No. 7, pp. 620-636—Jul. 2003.

Notification of the First Office Action Chinese Patent Application No. 2017114389574 dated Jan. 4, 2019.

Decision to Grant and Search Report Russian Patent Application No. 2018131100 dated Jan. 15, 2019.

Office Action Mexican Application No. MX/a/2015/016336 dated May 3, 2019.

Final Office Action U.S. Appl. No. 16/109,874 dated Jun. 27, 2019.

Notification of Reasons for Refusal Japanese Patent Application No. 2018-098441 dated Jun. 18, 2019.

Office Action Indonesian Patent Application No. P00201400206 dated May 21, 2019.

Decision to Grant KR 10-2018-7021274 dated Jul. 29, 2019.

Notice of Allowance dated Jul. 25, 2019 in Vietnamese Application 1-2014-00321.

(56) References Cited

OTHER PUBLICATIONS

Notice of Allowance dated Aug. 5, 2019 in Israeli Application 265152.
Notice of Allowance dated Aug. 8, 2019 in Philippine Application 12018500196.
Notice of Allowance dated Aug. 8, 2019 in Philippine Application 12018500195.
Notice of Allowance dated Aug. 9, 2019 in Philippine Application 12018500197.
Notice of Allowance dated Aug. 9, 2019 in Philippine Application 12018500198.
Notice of Acceptance dated Aug. 28, 2019 in Australian Application 2017208363.
Office Action dated Aug. 28, 2019 in European Application 18190116.6.
Office Action dated Sep. 29, 2019 in Chinese Application 201711438960.6.
Office Action dated Sep. 30, 2019 in Chinese Application 201711438957.4.
Office Action dated Oct. 8, 2019 in Philippine Application 1-2018-502511.
Notice of Allowance dated Oct. 31, 2019 in U.S. Appl. No. 16/109,874.
Office Action dated Nov. 3, 2019 in Egyptian Application 44/2014.
Notice of Allowance dated Dec. 18, 2019 in U.S. Appl. No. 16/578,716.
Clare, Gordon et al., "Wavefront Parallel Processing for HEVC Encoding and Decoding", Joint Collaborative Team on Video Coding (JCT-VC) of ITU-T SG16 WP3 and ISO/IEC JTC1/SC29/WG11, 6th Meeting, Torino, Jul. 2011, Document JCTVC-F274, 17 pages.
Hsu, Chih-Wei et al., "Wavefront Parallel Processing with Tiles", Joint Collaborative Team on Video Coding (JCT-VC) of ITU-T SG16 WP3 and ISO/IEC JTC1/SC29/WG11, 6th Meeting, Torino, Jul. 2011, Document JCTVC-F063, 8 pages.
Notice of Examination dated Nov. 17, 2019 in Israeli Application 270426.
Office Action dated Nov. 20, 2019 in Chinese Application 201711438973.3.
Decision to Grant dated Nov. 29, 2019 in Korean Application 10-2019-7031689.
Office Action dated Dec. 13, 2019 in Chinese Application 201711438960.6.
Office Action dated Jan. 6, 2020 in Chinese Application 201711438972.9.
Petition for Inter Partes Review of U.S. Pat. No. 9,729,891 filed Jan. 29, 2019 in IPR 2019-00617.
Petitioners Power of Attorney filed Jan. 29, 2019 in IPR 2019-00617.
Notice of Accord Filing Date filed Feb. 12, 2019 in IPR 2019-00617.
Mandatory Notices Under 37 C.F.R. 42.8(a)(2) of Patent Owner GE Video Compression, LLC filed Feb. 20, 2019.
Power of Attorney of Patent Owner GE Video Compression LLC filed Feb. 20, 2019 in IPR 2019-00617.
Errata filed Feb. 26, 2019 in IPR 2019-00617.
Corrected Petition for Inter Partes Review of U.S. Pat. No. 9,729,891 filed Feb. 26, 2019 in IPR 2019-00617.
Patent Owner's Preliminary Response filed May 13, 2019 in IPR 2019-00617.
Trial Instituted Document filed Aug. 1, 2019 in IPR 2019-00617.
Scheduling Order filed Aug. 1, 2019 in IPR 2019-00617.
Notice of Joint Stipulation to Modify Due Dates 1-3 in the Scheduling Order filed Sep. 3, 2019 in IPR 2019-00617.
Patent Owner's Notice of Deposition of Dr. Andrew Lippman filed Sep. 20, 2019 in IPR 2019-00617.
Patent Owner's Response filed Oct. 17, 2019 in IPR 2019-00617.
Patent Owner's Exhibit List filed Oct. 17, 2020 in IPR 2019-00617.
Notice of Joint Stipulation to Modify Due Dates 2-3 in the Scheduling Order filed Dec. 12, 2020 in IPR 2019-00617.
Notice of Joint Stipulation to Modify Due Dates 2-3 in the Scheduling Order filed Jan. 3, 2020 in IPR 2019-00617.
Petitioners Reply to Patent Owners Response filed Jan. 9, 2020 in IPR 2019-00617.
Petitioners Updated Mandatory Notice filed Jan. 10, 2020 in IPR 2019-00617.
Exhibit 1001—U.S. Pat. No. 9,729,891 filed Jan. 29, 2019 in IPR 2019-00617.
Exhibit 1002—File History of U.S. Pat. No. 9,729,891 filed Jan. 29, 2019 in IPR 2019-00617.
Exhibit 1003—Declaration of Dr. Andrew B. Lippman filed Jan. 29, 2019 in IPR 2019-00617.
Exhibit 1004—PCT Pub. No. WO 2011/042645A1 to Pateux et al. filed Jan. 29, 2019 in IPR 2019-00617.
Exhibit 1005—English Translation of WO 2011/042645A1 filed Jan. 29, 2019 in IPR 2019-00617.
Exhibit 1006—U.S. Pat. No. 9,467,699 to Huang et al. filed Jan. 29, 2019 in IPR 2019-00617.
Exhibit 1007—Richardson, The H.264 Advanced Video Compression Standard, Wiley (2010) filed Jan. 29, 2019 in IPR 2019-00617.
Exhibit 1008—Curriculum Vitae of Dr. Andrew B. Lippman filed Jan. 29, 2019 in IPR 2019-00617.
Exhbit 1009—Shi et al., Image and Video Compression for Multimedia Engineering Part 1 filed Jan. 29, 2019 in IPR 2019-00617.
Exhibit 1009—Shi et al., Image and Video Compression for Multimedia Engineering Part 2 filed Jan. 29, 2019 in IPR 2019-00617.
Exhibit 1009—Shi et al., Image and Video Compression for Multimedia Engineering Part 3 filed Jan. 29, 2019 in IPR 2019-00617.
Exhibit 1009—Shi et al., Image and Video Compression for Multimedia Engineering Part 4 filed Jan. 29, 2019 in IPR 2019-00617.
Exhibit 1009—Shi et al., Image and Video Compression for Multimedia Engineering Part 5 filed Jan. 29, 2019 in IPR 2019-00617.
Exhibit 1009—Shi et al., Image and Video Compression for Multimedia Engineering Part 6 filed Jan. 29, 2019 in IPR 2019-00617.
Exhibit 1009—Shi et al., Image and Video Compression for Multimedia Engineering Part 7 filed Jan. 29, 2019 in IPR 2019-00617.
Exhibit 1009—Shi et al., Image and Video Compression for Multimedia Engineering Part 8 filed Jan. 29, 2019 in IPR 2019-00617.
Exhibit 1009—Shi et al., Image and Video Compression for Multimedia Engineering Part 9 filed Jan. 29, 2019 in IPR 2019-00617.
Exhibit 1010—Shannon, Communication Theory of Secrecy Systems, Bell System Technical Journal, vol. 28-4, pp. 656-715, Oct. 1949 filed Jan. 29, 2019 in IPR 2019-00617.
Exhibit 1011—Symes, Video Compression Demystified, McGraw-Hill (2001) Part 1 filed Jan. 29, 2019 in IPR 2019-00617.
Exhibit 1011—Symes, Video Compression Demystified, McGraw-Hill (2001) Part 2 filed Jan. 29, 2019 in IPR 2019-00617.
Exhibit 1011—Symes, Video Compression Demystified, McGraw-Hill (2001) Part 3 filed Jan. 29, 2019 in IPR 2019-00617.
Exhibit 1011—Symes, Video Compression Demystified, McGraw-Hill (2001) Part 4 filed Jan. 29, 2019 in IPR 2019-00617.
Exhibit 1011—Symes, Video Compression Demystified, McGraw-Hill (2001) Part 5 filed Jan. 29, 2019 in IPR 2019-00617.
Exhibit 1011—Symes, Video Compression Demystified, McGraw-Hill (2001) Part 6 filed Jan. 29, 2019 in IPR 2019-00617.
Exhibit 1011—Symes, Video Compression Demystified, McGraw-Hill (2001) Part 7 filed Jan. 29, 2019 in IPR 2019-00617.
Exhibit 1011—Symes, Video Compression Demystified, McGraw-Hill (2001) Part 8 filed Jan. 29, 2019 in IPR 2019-00617.
Exhibit 1012—Poe, The Gold Bug, Project Gutenberg (2008) filed Jan. 29, 2019 in IPR 2019-00617.
Exhibit 1013—Petitioners Responses to Voluntary Interrogatories filed Jan. 29, 2019 in IPR 2019-00617.
Exhibit 1014—File History of U.S. Pat. No. 9,596,469 Part 1 filed Jan. 29, 2019 in IPR 2019-00617.
Exhibit 1014—File History of U.S. Pat. No. 9,596,469 Part 2 filed Jan. 29, 2019 in IPR 2019-00617.
Exhibit 1014—File History of U.S. Pat. No. 9,596,469 Part 3 filed Jan. 29, 2019 in IPR 2019-00617.
Exhibit 1014—File History of U.S. Pat. No. 9,596,469 Part 4 filed Jan. 29, 2019 in IPR 2019-00617.

(56) References Cited

OTHER PUBLICATIONS

Exhibit 1015—Marpe, Context-based Adaptive Binary Arithmetic Coding in the H.264 / AVC Video Compression Standard Exhibit 1014 filed Jan. 29, 2019 in IPR 2019-00617.
Exhibit 1016—Declaration of Dr. Jacob Munford filed Jan. 29, 2019 in IPR 2019-00617.
Exhibit 2001—Advanced Adaptation Algorithms of Arithmetic Coding in Hybrid Video Compression,Â¿Â¿Â¿ Doctoral Dissertation of Damian Karwowski filed May 13, 2019 in IPR 2019-00617.
Ex. 2002—Declaration of Mark-Steffen Kamp filed Oct. 17, 2019 in IPR 2019-00617.
Ex. 2003—CV of Dr. Mark-Steffen Kamp filed Oct. 17, 2019 in IPR 2019-00617.
Ex. 2004—Advanced Video Coding for Generic Audiovisual Services filed Oct. 17, 2019 in IPR 2019-00617.
Ex. 2005—Entropy Slices for Parallel Entropy Coding filed Oct. 17, 2019 in IPR 2019-00617.
Ex. 2006—Parallel decoding for high resolution video coding filed Oct. 17, 2019 in IPR 2019-00617.
Ex. 2007—Mirsa, et al., Joint Collaborative Team on Video Coding filed Oct. 17, 2019 in IPR 2019-00617.
Ex. 2008—Hoffman, et al., U.S. Pat. No. 7,365,659 filed Oct. 17, 2019 in IPR 2019-00617.
Ex. 2009—Sze, et al., Entropy Coding in HEVC High Efficiency Video Coding filed Oct. 17, 2019 in IPR 2019-00617.
Ex. 2010—Karwoski, et al., Improved Context-Adaptive Arithmetic Coding in H.264/AVC filed Oct. 17, 2019 in IPR 2019-00617.
Ex. 2011—T. Suzuki, Arithmetic coding in high level syntax filed Oct. 17, 2019 in IPR 2019-00617.
Ex. 2012—Berkhoff, MSc Thesis: Analysis and Implementation of the H.264 CABAC Entropy Decoding Engine filed Oct. 17, 2019 in IPR 2019-00617.
Ex. 2013—Hoffman, MS Thesis: Efficient Software and Hardware Implementations of the H.264 Entropy Encoders filed Oct. 17, 2019 in IPR 2019-00617.
Ex. 2014—T. Wiegand et al., WD3: Working Draft 3 of High-Efficiency Video Coding filed Oct. 17, 2019 in IPR 2019-00617.
Ex. 2015—M. Narroschke et al., Restart of CABAC after coding of ALF and SAO slice header data filed Oct. 17, 2019 in IPR 2019-00617.
Ex. 2016—Deposition Transcript of Dr. Andrew Lippman filed Oct. 17, 2019 in IPR 2019-00617.
Ex. 2017—Gordon, et al., Wavefront and Cabac Flush filed Oct. 17, 2019 in IPR 2019-00617.
Notice of Allowance dated Jan. 7, 2020 in Japanese Application 2018-098441.
Office Action dated Dec. 13, 2019 in Mexican Application MX/a/2015/016336. (No New Refs).
Notice of Allowance dated Feb. 10, 2020 in U.S. Appl. No. 16/109,874. (No New Refs).
Notice of Allowance dated Feb. 10, 2020 in U.S. Appl. No. 16/578,716. (No New Refs).
Office Action dated Mar. 4, 2020 in Chinese Application 201711438957.4. (No New Refs).
Paper 19—Petitioner's Request for Oral Argument filed Jan. 24, 2020 in IPR2019-00617.
Paper 20—Petitioner's Motion to Excuse Late Filing of Request for Oral Argument filed Jan. 28, 2020 in IPR2019-00617.
Paper 21—Decision issued Jan. 31, 2020 Granting Petitioner's Motion to Excuse Late Filing of Request for Oral Argument in IPR2019-00617.
Paper 22—Order issued Jan. 31, 2020 Granting Oral Hearing Request in IPR2019-00617.
Paper 23—Patent Owner's Sur-Reply to Petitioner's Rely to Patent Owner's Response filed Feb. 20, 2020 in IPR2019-00617.
Paper 24—Patent Owner's Amended Exhibit List filed Feb. 20, 2020 in IPR2019-00617.
Ex. 1017—Petitioner Unified Patent's Demonstratives filed Feb. 27, 2020 in IPR2019-00617.
Ex. 2018—U.S. 20100098155 (Demircin et al.) filed Feb. 20, 2020 in IPR2019-00617.
Ex. 2019—Lipman Deposition Transcript filed Feb. 20, 2020 in IPR2019-00617.
Ex. 2020—Patent Owner's Demonstratives filed Feb. 27, 2020 in IPR2019-00617.
Notice of Allowance dated Apr. 23, 2020 in Israeli Application 270426.
Notice of Allowance dated May 4, 2020 in U.S. Appl. No. 16/840,043.
Office Action dated May 31, 2020 in Korean Application 10-2020-7005993.
Office Action dated Jun. 25, 2020 in U.S. Appl. No. 16/877,617.
Office Action dated Jul. 3, 2020 in Chinese Application 201711438960.6.
Office Action dated Jul. 23, 2020 in Malaysian Application PI 2017001955.
Office Action dated Jul. 26, 2020 in Israeli Application 276219. (No New Refs).
Office Action dated Jul. 14, 2020 in Chinese Application 201711438973.3.
Gordon Clare et al., "Wavefront Parallel Processing for HEVC Encoding and Decoding", Joint Collaborative Team on Video Coding (JCT-VC) of ITU-T SG16 WP3 and ISO/IEC JTC1/SC29/WG11 6th Meeting: Torino, IT, Jul. 14-22, 2011, JCTVC.F274-v1.
Office Action issued in corresponding Chinese Patent Application No. 201711438972.9 dated Nov. 6, 2020.
Paper 27—Final Written Decision in IPR2019-00617 dated Jun. 25, 2020.
Notice of Acceptance dated Aug. 19, 2020 in Australian Application 2019275583.
Decision to Grant dated Aug. 31, 2020 in Korean Application 10-2020-7005993.
Office Action dated Sep. 23, 2020 in European Application 18190116.6.
Notice of Issuance issued in corresponding Chinese Patent Application No. 201711438960.6 dated Jan. 14, 2021.
Notice Before Allowance issued in corresponding Israeli Patent Application No. 276219 dated Jan. 31, 2021.
Office Action issued in corresponding Chinese Patent Application No. 2017114389733 dated Feb. 24, 2021, with English Translation.
Office Action issued in corresponding Korean Patent Application No. 10-2020-7034469 dated Mar. 22, 2021, with English Translation.

\* cited by examiner

SAMPLE ARRAY CODING FOR LOW-DELAY

CROSS-REFERENCE TO RELATED APPLICATIONS

The present application is a continuation of U.S. patent application Ser. No. 16/840,043 filed Apr. 3, 2020, which is a continuation of U.S. patent application Ser. No. 16/578,716 filed Sep. 23, 2019, now U.S. Pat. No. 10,652,564, which is a continuation of U.S. patent application Ser. No. 16/109,874, filed Aug. 23, 2018, now U.S. Pat. No. 10,659,798, which is a continuation of U.S. patent application Ser. No. 15/824,196, filed Nov. 28, 2017, now U.S. Pat. No. 10,085,035, which is a continuation of U.S. patent application Ser. No. 15/639,312, filed Jun. 30, 2017, now U.S. Pat. No. 9,860,547, which is a continuation of U.S. patent application Ser. No. 15/414,356, filed Jan. 24, 2017, now U.S. Pat. No. 9,729,891, which is a continuation of U.S. patent application Ser. No. 14/141,374, filed Dec. 26, 2013, now U.S. Pat. No. 9,596,469, which is a continuation of International Application No. PCT/EP2012/063929, filed Jul. 16, 2012, which claims priority from U.S. Provisional Application No. 61/508,477, filed Jul. 15, 2011, all of which are incorporated herein by reference in their entireties.

BACKGROUND OF THE INVENTION

The present application is concerned with sample array coding such as picture or video coding.

Parallelization of encoder and decoder is very important due to the increased processing requirements by the HEVC standard as well as by the expected increase of video resolution. Multi-core architectures are becoming available in a wide range of modern electronic devices. Consequently, efficient methods to enable the use of multiple-core architectures are necessitated.

Encoding or decoding of LCUs occurs in raster scan, by which the CABAC probability is adapted to the specificities of each image. Spatial dependencies exist between adjacent LCUs. Each LCU (largest coding unit) depends on its left, above, above-left and above-right neighbor LCUs, because of different components, for instance, motion-vector, prediction, intra-prediction and others. Due to enable parallelization in decoding, these dependencies typically need to be interrupted or are interrupted in state-of-the-art applications.

Some concepts of parallelization, namely wavefront processing have been proposed. The motivator for the further study is to perform techniques, which lower the coding efficiency loss and thus reduce the burden on the bitstream for parallelization approaches in encoder and decoder. Furthermore, low-delay processing was not possible with the available techniques.

Thus, it is the object of the present invention to provide a coding concept for sample arrays allowing lower delay at comparatively less penalties in coding efficiency.

SUMMARY

According to an embodiment, a decoder for reconstructing a sample array from an entropy encoded data stream may be configured to: entropy decode a plurality of entropy slices within the entropy encoder data stream so as to reconstruct different portions of the sample array associated with the entropy slices, respectively, with performing, for each entropy slice, the entropy decoding along a respective entropy coding path using respective probability estimations, adapting the respective probability estimations along the respective entropy coding path using a previously decoded part of the respective entropy slice, starting the entropy decoding the plurality of entropy slices sequentially using an entropy slice order, and performing, in entropy decoding a predetermined entropy slice, entropy decoding a current part of the predetermined entropy slice based on the respective probability estimations of the predetermined entropy slice as adapted using the previously decoded part of the predetermined entropy slice, and probability estimations as used in the entropy decoding of a spatially neighboring, in entropy slice order preceding entropy slice at a neighboring part of the spatially neighboring entropy slice.

According to another embodiment, a decoder configured to reconstruct a sequence of sample arrays from an entropy encoded data stream may be configured to: entropy decode a current frame of the entropy encoded data stream so as to reconstruct a current sample array of the sequence of sample arrays, perform the entropy decoding along an entropy coding path and using probability estimations and adapt the probability estimations along the entropy coding path using a previously decoded part of the current frame, wherein the decoder is configured to initialize or determine the probability estimations for the current frame based on probability estimations used in decoding a previously decoded frame of the entropy encoded data stream.

According to another embodiment, an encoder for encoding a sample array into an entropy encoded data stream may be configured to: entropy encode a plurality of entropy slices into the entropy encoder data stream each entropy slice being associated with a different portion of the sample array, respectively, with performing, for each entropy slice, the entropy encoding along a respective entropy coding path using respective probability estimations, adapting the respective probability estimations along the respective entropy coding path using a previously decoded part of the respective entropy slice, starting the entropy encoding the plurality of entropy slices sequentially using an entropy slice order, and performing, in entropy encoding a predetermined entropy slice, entropy encoding a current part of the predetermined entropy slice based on the respective probability estimations of the predetermined entropy slice as adapted using the previously encoded part of the predetermined entropy slice, and probability estimations as used in the entropy encoding of a spatially neighboring, in entropy slice order preceding entropy slice at a neighboring part of the spatially neighboring entropy slice.

According to still another embodiment, an encoder configured to encode a sequence of sample arrays into an entropy encoded data stream may be configured to: entropy encode a current frame of the entropy encoded data stream so as to reconstruct a current sample array of the sequence of sample arrays, perform the entropy encoding along an entropy coding path and using probability estimations and adapt the probability estimations along the entropy coding path using a previously encoded part of the current frame, wherein the encoder is configured to initialize or determine the probability estimations for the current frame based on probability estimations used in encoding a previously encoded frame of the entropy encoded data stream.

According to another embodiment, a method for reconstructing a sample array from an entropy encoded data stream may have the steps of: entropy decoding a plurality of entropy slices within the entropy encoder data stream so as to reconstruct different portions of the sample array associated with the entropy slices, respectively, with performing, for each entropy slice, the entropy decoding along a respective entropy coding path using respective probability estimations, adapting the respective probability estimations along the respective entropy coding path using a previously decoded part of the respective entropy slice, starting the entropy decoding the plurality of entropy slices sequentially using an entropy slice order, and performing, in entropy decoding a predetermined entropy slice, entropy decoding a current part of the predetermined entropy slice based on the respective probability estimations of the predetermined entropy slice as adapted using the previously decoded part of the predetermined entropy slice, and probability estimations as used in the entropy decoding of a spatially neighboring, in entropy slice order preceding entropy slice at a neighboring part of the spatially neighboring entropy slice.

According to another embodiment, a method configured to reconstruct a sequence of sample arrays from an entropy encoded data stream may have the steps of: entropy decoding a current frame of the entropy encoded data stream so as to reconstruct a current sample array of the sequence of sample arrays, performing the entropy decoding along an entropy coding path and using probability estimations and adapting the probability estimations along the entropy coding path using a previously decoded part of the current frame, and wherein the method comprises initialize or determine the probability estimations for the current frame based on probability estimations used in decoding a previously decoded frame of the entropy encoded data stream.

According to still another embodiment, a method for encoding a sample array into an entropy encoded data stream may have the steps of: entropy encoding a plurality of entropy slices into the entropy encoder data stream each entropy slice being associated with a different portion of the sample array, respectively, with performing, for each entropy slice, the entropy encoding along a respective entropy coding path using respective probability estimations, adapting the respective probability estimations along the respective entropy coding path using a previously decoded part of the respective entropy slice, starting the entropy encoding the plurality of entropy slices sequentially using an entropy slice order, and performing, in entropy encoding a predetermined entropy slice, entropy encoding a current part of the predetermined entropy slice based on the respective probability estimations of the predetermined entropy slice as adapted using the previously encoded part of the predetermined entropy slice, and probability estimations as used in the entropy encoding of a spatially neighboring, in entropy slice order preceding entropy slice at a neighboring part of the spatially neighboring entropy slice.

According to another embodiment, a method for encoding a sequence of sample arrays into an entropy encoded data stream may have the steps of: entropy encoding a current frame of the entropy encoded data stream so as to reconstruct a current sample array of the sequence of sample arrays, performing the entropy encoding along an entropy coding path and using probability estimations and adapting the probability estimations along the entropy coding path using a previously encoded part of the current frame, wherein the method has initializing or determining the probability estimations for the current frame based on probability estimations used in encoding a previously encoded frame of the entropy encoded data stream.

Another embodiment may have a computer program having a program code configured to perform, when running on a computer, the methods as mentioned above.

If the entropy coding of a current part of a predetermined entropy slice is based on, not only, the respective probability estimations of the predetermined entropy slice as adapted using the previously coded part of the predetermined entropy slice, but also probability estimations as used in the entropy coding of a spatially neighboring, in entropy slice order preceding entropy slice at a neighboring part thereof, the probability estimations used in entropy coding are adapted to the actual symbol statistics more closely, thereby lowering the coding efficiency decrease normally caused by lower-delay concepts. Temporal interrelationships may be exploited additionally or alternatively.

For example, the dependency on probability estimations as used in the entropy coding of a spatially neighboring, in entropy slice order preceding entropy slice may involve the initialization of the probability estimations at the beginning of entropy coding the predetermined entropy slice. Usually, probability estimations are initialized to values adapted to symbol statistics of a representative blend of sample array material. In order to avoid the transmission of the initialization values of the probability estimations, they are known to encoder and decoder by convention. However, such pre-defined initialization values are, naturally, merely a compromise between side information bitrate on the one hand and coding efficiency on the other hand as such initialization values naturally—more or less—deviate from the actual sample statistics of the currently coded sample array material. The probability adaptation during the course of coding an entropy slice adapts the probability estimations to the actual symbol statistics. This process is accelerated by initializing the probability estimations at the beginning of entropy coding the current/predetermined entropy slice using already adapted probability estimations of the just-mentioned spatially neighboring, in entropy slice order preceding entropy slice as the latter values have already been, to some extent, adapted to the actual symbol statistics of the sample array currently at hand. Low-delay coding may nevertheless be enabled by using, in initializing the probability estimations for the predetermined/current entropy slices, the probability estimation used at the neighboring part thereof, rather than manifesting themselves at the end of entropy coding the preceding entropy slice. By this measure, wavefront processing is still possible.

Further, the above-mentioned dependency on the probability estimations as used in the entropy coding of the spatially neighboring, in entropy slice order preceding entropy slice may involve the adaptation process of adapting the probability estimations used in entropy coding the current/predetermined entropy slice itself. Probability estimation adaptation involves the use of the just-coded part, i.e., the just-coded symbol(s), in order to adapt the current state of the probability estimations to the actual symbol statistics. By this measure, initialized probability estimations are adapted at some adaptation rate to the actual symbol statistic. This adaptation rate is increased by performing the just-mentioned probability estimation adaptation not only based on the currently coded symbol of the current/predetermined entropy slice, but also dependent on probability estimations as manifesting themselves at a neighboring part of the spatial neighboring, in entropy slice order preceding entropy slice. Again, by choosing the spatially neighborhood of the current part of the current entropy slice and the neighboring part of the preceding entropy slice appropriately, wavefront processing is still possible. The benefit from coupling the own probability estimation adaption along the current entropy slice, with the probability adaptation of the preceding entropy slice is the increased rate at which the adaptation to the actual symbol statistics takes place as the number of symbols traversed in the current and previous entropy slices contributes to the adaptation, rather than merely the symbols of the current entropy slice.

BRIEF DESCRIPTION OF THE DRAWINGS

Embodiments of the present invention will be described subsequently referring to the appended drawings, in which.

DETAILED DESCRIPTION OF THE INVENTION

Figure 1:
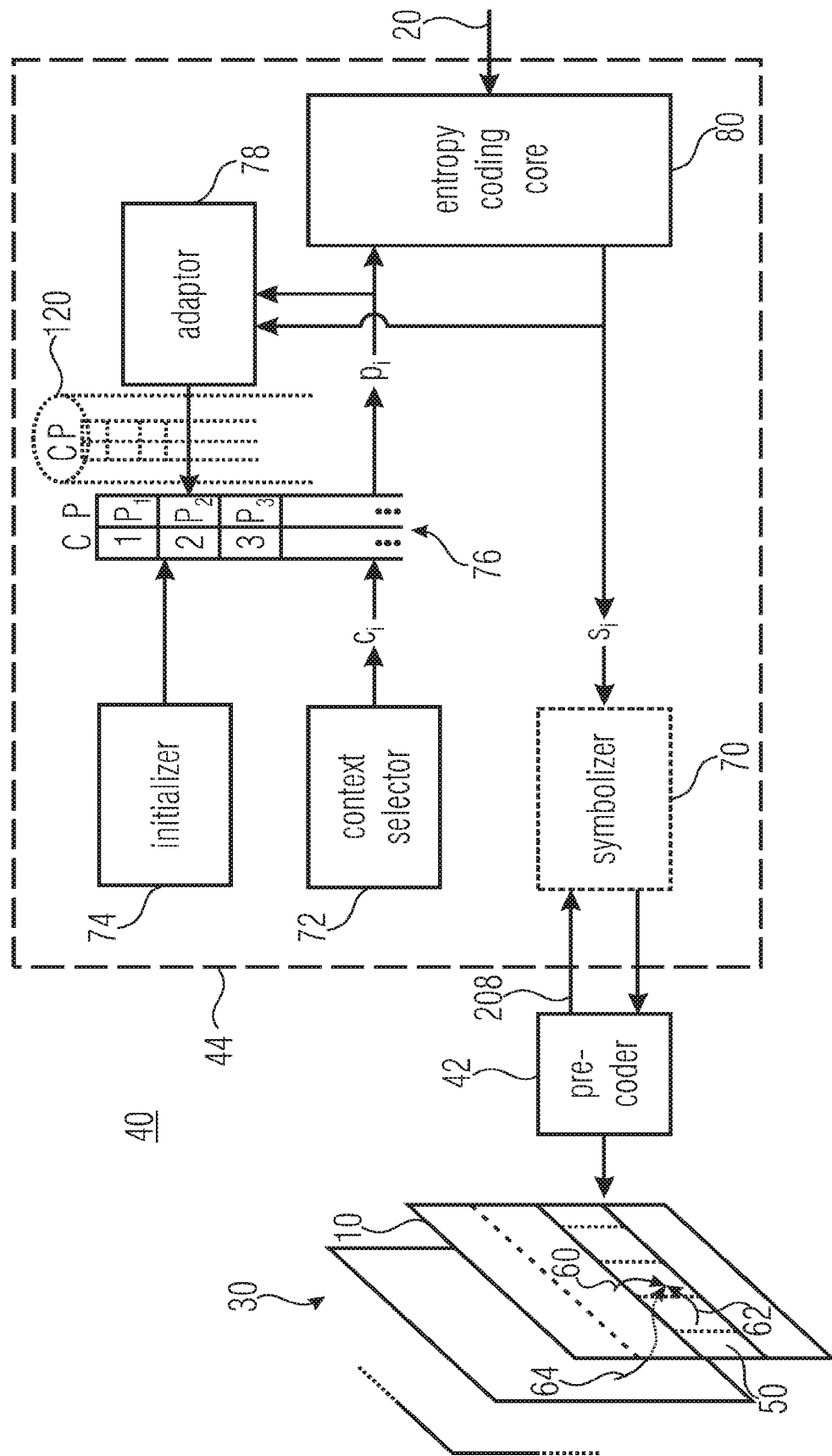
FIG. 1 shows a block diagram of an exemplary encoder.

In order to ease the understanding of the below-outlined measures for improving the achievement of low-delay at less penalties in terms of coding efficiency, the encoder of FIG. 1 is firstly described in more general terms without, preliminarily, discussing the advantageous concepts of embodiments of the present application and how same may be built into the embodiment of FIG. 1. It should be mentioned, however, that the structure shown in FIG. 1 merely serves as an illustrative environment in which embodiments of the present application may be used. Generalizations and alternatives for encoders and decoders in accordance with embodiments of the present invention are also briefly discussed.

FIG. 1 shows an encoder for encoding a sample array 10 into an entropy encoded data stream 20. As shown in FIG. 1, the sample array 10 may be one of a sequence 30 of sample arrays and the encoder may be configured to encode the sequence 30 into the data stream 20.

The encoder of FIG. 1 is generally indicated by reference sign 40 and comprises a precoder 42 followed by an entropy encoding stage 44, the output of which outputs data stream 20. The precoder 42 is configured to receive and operate on sample array 10 in order to describe the content thereof by way of syntax elements of a predetermined syntax with each syntax element being of a respective one of a predetermined set of syntax element types which, in turn, are associated with a respective semantics.

Figure 2:
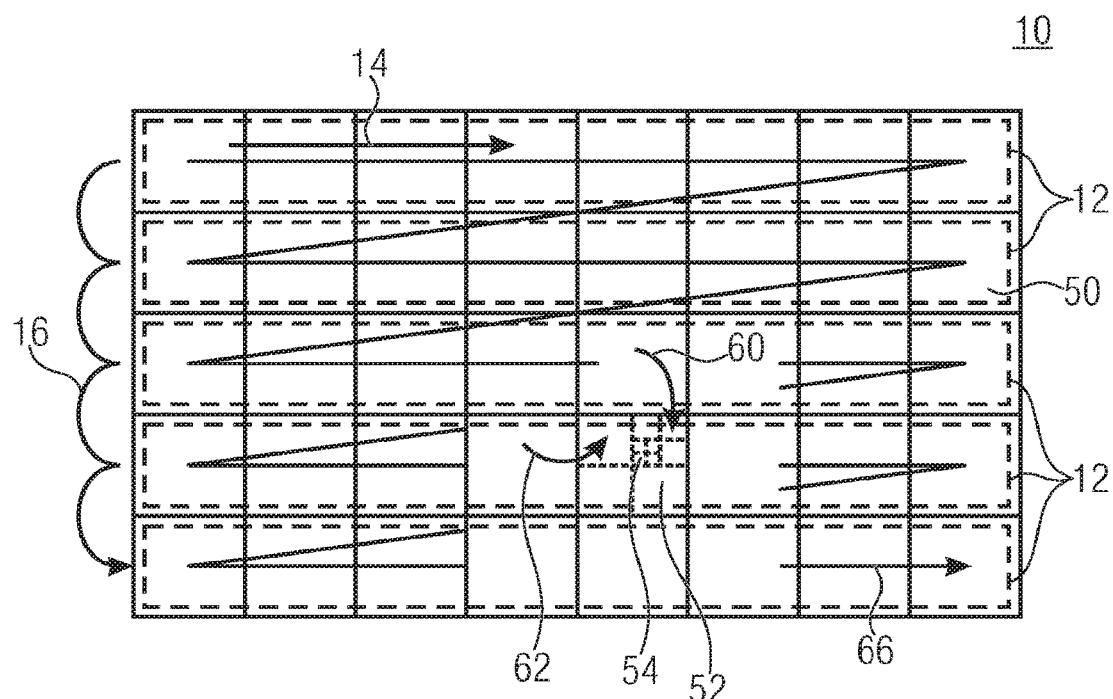
FIG. 2 shows a schematic diagram of a partitioning of a picture into slices and slice parts (i.e. blocks or coding units) along with coding orders defined thereamong.

In describing the sample array 10 using the syntax elements, the precoder 42 may subdivide the sample array 10 into coding units 50. The term "coding unit" may, for reasons set out in more detail below, alternatively be called "coding tree units" (CTU)s. One possibility of how precoder 42 may subdivide the sample array 10 into coding units 50 is exemplarily shown in FIG. 2. In accordance with this example, the subdivision regularly subdivides the sample array 10 into coding units 50, so that the latter are arranged in rows and columns so as to gaplessly cover the complete sample array 10 without overlap. In other words, precoder 42 may be configured to describe each coding unit 50 by way of syntax elements. Some of these syntax elements may form subdivision information for further subdividing the respective coding unit 50. For example, by way of multi-tree subdivisioning, the subdivision information may describe a subdivision of the respective coding unit 50 into prediction blocks 52 with the precoder 42 associating a prediction mode with associated prediction parameters for each of these prediction blocks 52. This prediction subdivision may allow for the prediction blocks 52 being different in size as illustrated in FIG. 2. The precoder 42 may also associate residual subdivision information with the prediction blocks 52 so as to further subdivide the prediction blocks 52 into residual blocks 54 so as to describe the prediction residual per prediction block 52. Thus, precoder may be configured to generate a syntax description of sample array 10 in accordance with a hybrid coding scheme. However, as already noted above, the just-mentioned way that the precoder 42 describes the sample array 10 by way of syntax elements has merely been presented for illustration purposes and may also be implemented differently.

The precoder 42 may exploit spatial interrelationships between content of neighboring coding units 50 of sample array 10. For example, precoder 42 may predict syntax elements for a certain coding unit 50 from syntax elements determined for previously coded coding units 50 which are spatially adjacent to the currently coded coding unit 50. In FIGS. 1 and 2, for example, the top and left-hand neighbors serve for prediction as illustrated by arrows 60 and 62. Moreover, precoder 42 may, in an intra-prediction mode, extrapolate already coded content of neighboring coding units 50 into the current coding unit 50 so as to obtain a prediction of the samples of the current coding unit 50. As shown in FIG. 1, precoder 42 may, beyond exploiting spatial interrelationships, temporarily predict samples and/or syntax elements for a current coding unit 50 from previously coded sample arrays as illustratively shown in FIG. 1 by way of arrow 64. That is, motion-compensated prediction may be used be precoder 42, and the motion vectors themselves may be subject to temporal prediction from motion vectors of previously coded sample arrays.

That is, precoder 42 may describe the content of sample array 10 coding unit wise and may, to this end, use spatial prediction. The spatial prediction is restricted for each coding unit 50 to spatially neighboring coding units of the same sample array 10 such that when following a coding order 66 among the coding units 50 of sample array 10, the neighboring coding units serving as prediction reference for the spatial prediction, have generally been traversed by the coding orders 66 prior to the current coding unit 50. As illustrated in FIG. 2, the coding order 66 defined among the coding units 50 may, for example, be a raster scan order according to which coding units 50 are traversed row by row from top to bottom. Optionally, a subdivision of array 10 into an array of tiles may cause the scan order 66 to traverse—in a raster scan order—the coding units 50 composing one tile first before preceding to the next in a tile order which, in turn, may also be of a raster scan type. For example, the spatial prediction may involve merely neighboring coding units 50 within a coding unit row above the coding unit row within which the current coding unit 50 resides, and a coding unit within the same coding unit row, but to the left relative to the current coding unit. As will be explained in more detail below, this restriction onto the spatial interrelationship/spatial prediction, enables parallel wavefront processing.

Precoder 42 forwards the syntax elements to the entropy coding stage 44. As just outlined, some of these syntax elements have predictively been coded, i.e. represent prediction residuals. Precoder 42 may, thus, be regarded as a predictive coder. Beyond that, precoder 42 may be a transform coder configured to transform code residuals of the prediction of the content of the coding units 50.

An exemplary internal structure of the entropy coding stage 44 is also shown in FIG. 1. As shown, the entropy coding stage 44 may comprise, optionally, a symbolizer for converting each of syntax elements received from precoder 42, the number of possible states of which exceed the symbol alphabet's cardinality into a sequence of symbols $s_i$ of the symbol alphabet based on which the entropy coding engine 44 operates. Beyond that optional symbolizer 70, the entropy coding engine 44 may comprise a context selector 72 and an initializer 74, a probability estimation manager 76, a probability estimation adaptor 78 and an entropy coding core 80. The entropy coding core's output forms the output of entropy coding stage 44. Besides, the entropy coding core 80 comprises two inputs, namely one for receiving the symbols $s_i$ of the sequence of symbols, and another one for receiving a probability estimation $p_i$ for each of the symbols.

Owing to the properties of entropy coding, the coding efficiency in terms of compression rate, increases with an improvement of the probability estimation: the better the probability estimation matches the actual symbol statistics, the better the compression rate.

In the example of FIG. 1, the context selector 72 is configured to select, for each symbol $s_i$, a corresponding context $c_i$ among a set of available contexts managed by manager 76. It should be noted, however, that the context selection forms merely an optional feature and may be left off with, for example, using the same context for each symbol. However, if using the context selection, context selector 72 may be configured to perform the context selection at least partially based on information concerning coding units outside the current coding unit, namely concerning neighboring coding units within the restricted neighborhood discussed above.

Manager 76 comprises a storage which stores, for each available context an associated probability estimation. For example, the symbol alphabet may be a binary alphabet so that merely one probability value may have to be stored for each available context.

The initializer 74 may, intermittently, initialize or re-initialize the probability estimations stored within manager 76 for the available contexts. Possible time instants at which such initialization may be performed, are discussed further below.

The adapter 78 has access to the pairs of symbols $s_i$ and corresponding probability estimations $p_i$ and adapts the probability estimations within manager 76 accordingly. That is, each time a probability estimation is applied by entropy coding core 80 so as to entropy code the respective symbol $s_i$, into data stream 20, adapter 78 may vary this probability estimation in accordance with the value of this current symbol $s_i$, so that this probability estimation $p_i$ is better adapted to the actual symbol statistics when encoding the next symbol which is associated with that probability estimation (by way of its context). That is, adaptor 78 receives the probability estimation for the selected context from manager 76 along with the corresponding symbol $s_i$ and adapts the probability estimation $p_i$ accordingly so that, for the next symbol $s_i$ of the same context $c_i$, the adaptive probability estimation is used.

The entropy coding core 80 is, for example, configured to operate in accordance with an arithmetic coding scheme or in a probability-interval-partitioning-entropy coding scheme. In arithmetic coding, entropy coding core 80 would, for example, continuously update its state when coding the sequence of symbols, with the state being defined by a probability interval defined by a probability interval width value and probability interval offset value, for example. When operating in the pipe concept, the entropy coding core 80 would, for example, subdivide the domain of possible values of the probability estimations into different intervals with performing fixed-probability entropy coding with respect to each of these intervals, thereby obtaining a substream for each of the sub-intervals the coding efficiency of which is respectively tailored to the associated probability interval. In case of entropy coding, the data stream 20 output would be an arithmetically coded data stream signaling to the decoding side information enabling emulating or redoing the interval subdivision process.

Naturally, it would be possible for entropy coding state 44 to entropy code all information, i.e. all syntax elements/symbols $s_i$, relating to sample array 10 with initializing the probability estimations merely once at the beginning thereof, and then continuously updating the probability estimations by adaptor 78. This would, however, result in a data stream 20 which would have to be sequentially decoded at the decoding side. In other words, there would not be a possibility for any decoder to subdivide resulting data stream into several sub-portions and decoding the sub-portions in parallel. This would, in turn, hamper any low-delay efforts.

Accordingly, as will be outlined in more detail below, it is favorable to subdivide the amount of data describing the sample array 10 into so-called entropy slices. Each of these entropy slices would, accordingly, cover a different set of the syntax elements relating to the sample array 10. If the entropy coding stage 44 would, however, entropy encode each entropy slice completely independent of each other by firstly initializing the probability estimation once with then continuously updating the probability estimation for each entropy slice individually, then the coding efficiency would be decreased due to the increased percentage of the data relating to, and describing, the sample array 10 for which the probability estimations used are (yet) less accurately adapted to the actual symbol statistics.

Figure 3:
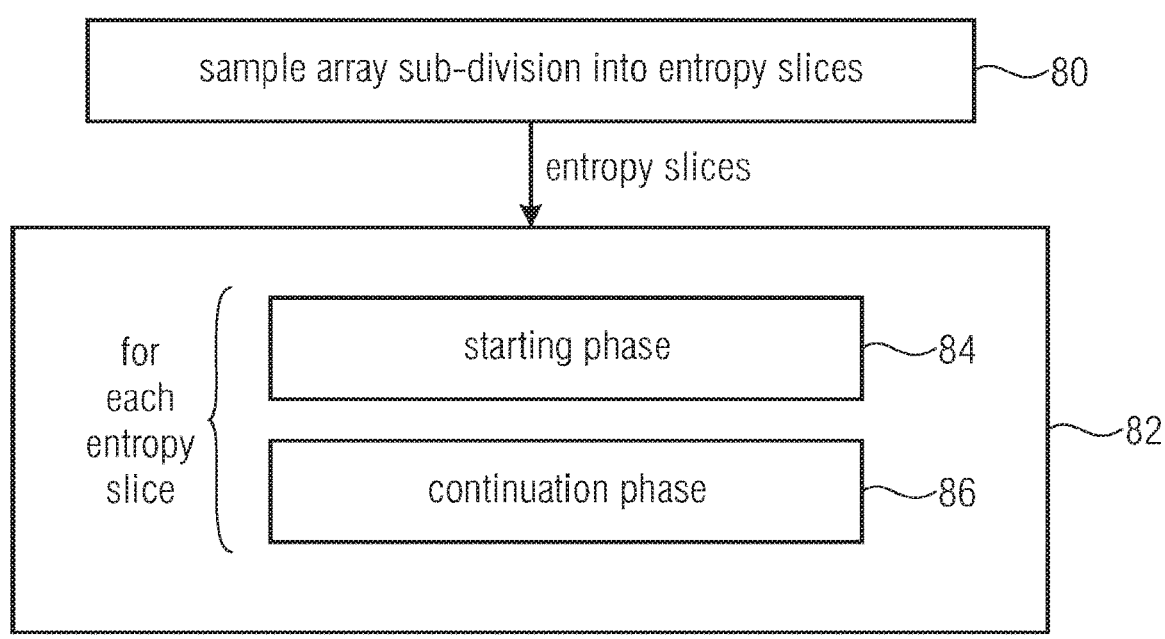
FIG. 3 shows a flow diagram of functionality of an exemplary encoder such as the one of FIG. 1.

In order to overcome the just-mentioned problems in accommodating the wish for low coding delay on the one hand and high coding efficiency on the other hand, the following encoding scheme may be used, which is now described with respect to FIG. 3.

Firstly, the data describing the sample array 10 is subdivided into portions called "entropy slices" in the following. The subdivision 80 needs not to be overlap-free. On the other hand, this subdivision may at least partially correspond to a spatial subdivision of the sample array 10 into different portions. That is, according to the subdivision 80, syntax elements describing sample array 10 may be distributed onto different entropy slices depending on the location of the coding unit 50 which the respective syntax element relates to. See, for example, FIG. 2. FIG. 2 shows an exemplary subdivision of sample array 10 into different portions 12. Each portion corresponds to a respective entropy slice. As exemplarily shown, each portion 12 corresponds to a row of coding units 50. Other subdivisions are, however, feasible as well. However, it is advantageous if the subdivision of the sample array 10 into portions 12 follows the aforementioned coding order 66 so that portions 12 cover consecutive runs of coding units 12 along the coding order 66. Even if so, however, the start and end positions of portion 12 along coding order 66 need not coincide with the left-hand and right-hand edges of the rows of coding units 50, respectively. Even a coincidence with the borders of coding units 50 immediately follow each other and coding order 66 does not need to be mandatory.

By subdividing sample array 10 in that way, an entropy slice order 16 is defined among portions 12 along which portions 12 follow each other along the coding order 66. Moreover, for each entropy slice, a respective entropy coding path 14 is defined, namely the fragment of coding path 66 running to the respective portion 12. In the example of FIG. 2 where portions 12 coincide with the rows of coding units 50, the entropy coding paths 14 of each entropy slice point along the row direction, in parallel to each other, i.e. here from the left-hand side to the right-hand side.

It should be noted that it would be possible to restrict spatial predictions performed by precoder 42 and context derivations performed by context selector 72 so as to not cross slice boundaries, i.e. so that the spatial predictions and context selections do not depend on data corresponding to another entropy slice. This way, the "entropy slices" would correspond the usual definition of "slices" in H.264, for example, which are completely decodable independently from each other, except for the below-outlined probability initialization/adaptation dependency. However, it would also be feasible to allow spatial predictions and context selections, i.e. generally speaking dependencies, to cross slice boundaries in order to exploit local/spatial inter-dependencies as WPP processing is still feasible even as far as the reversal of the precoding, i.e. the reconstruction based on the syntax elements, and the entropy context selection is concerned. In so far, the entropy slices would somehow correspond to "dependent slices".

Subdivision 80 may, for example, be performed by entropy coding stage 44. The subdivision may be fixed or may vary among the array of sequence 30. The subdivision may be fixed per convention or may be signaled within data stream 20.

Based on the entropy slices, the actual entropy coding may take place, i.e. 82. For each entropy slice, the entropy coding may be structured into a starting phase 84 and a continuation phase 86. The staring phase 84 involves, for example, the initialization of the probability estimations as well as the triggering of the actual entropy coding process for the respective entropy slice. The actual entropy coding is then performed during the continuation phase 86. The entropy coding during phase 86 is performed along the respective entropy coding path 14. The starting phase 84 for each entropy slice is controlled such that the entropy coding of the plurality of entropy slices starts sequentially using the entropy slice order 16.

Now, in order to avoid the above-outlined penalty which would result from entropy coding each entropy slice completely independent of each other, the entropy coding process 82 is controlled such that a current part, e.g. a current coding unit of a current entropy slice is entropy coded based on the respective probability estimations of the current entropy slice as adapted using the previously encoded part of the current entropy slice, i.e. the part of the current entropy slice to the left of the current coding unit 50 in case of FIG. 2, and the probability estimations as used in entropy coding the spatially neighboring, in entropy slice order 16 preceding entropy slice at a neighboring part, i.e. a neighboring coding unit, thereof.

Figure 4:
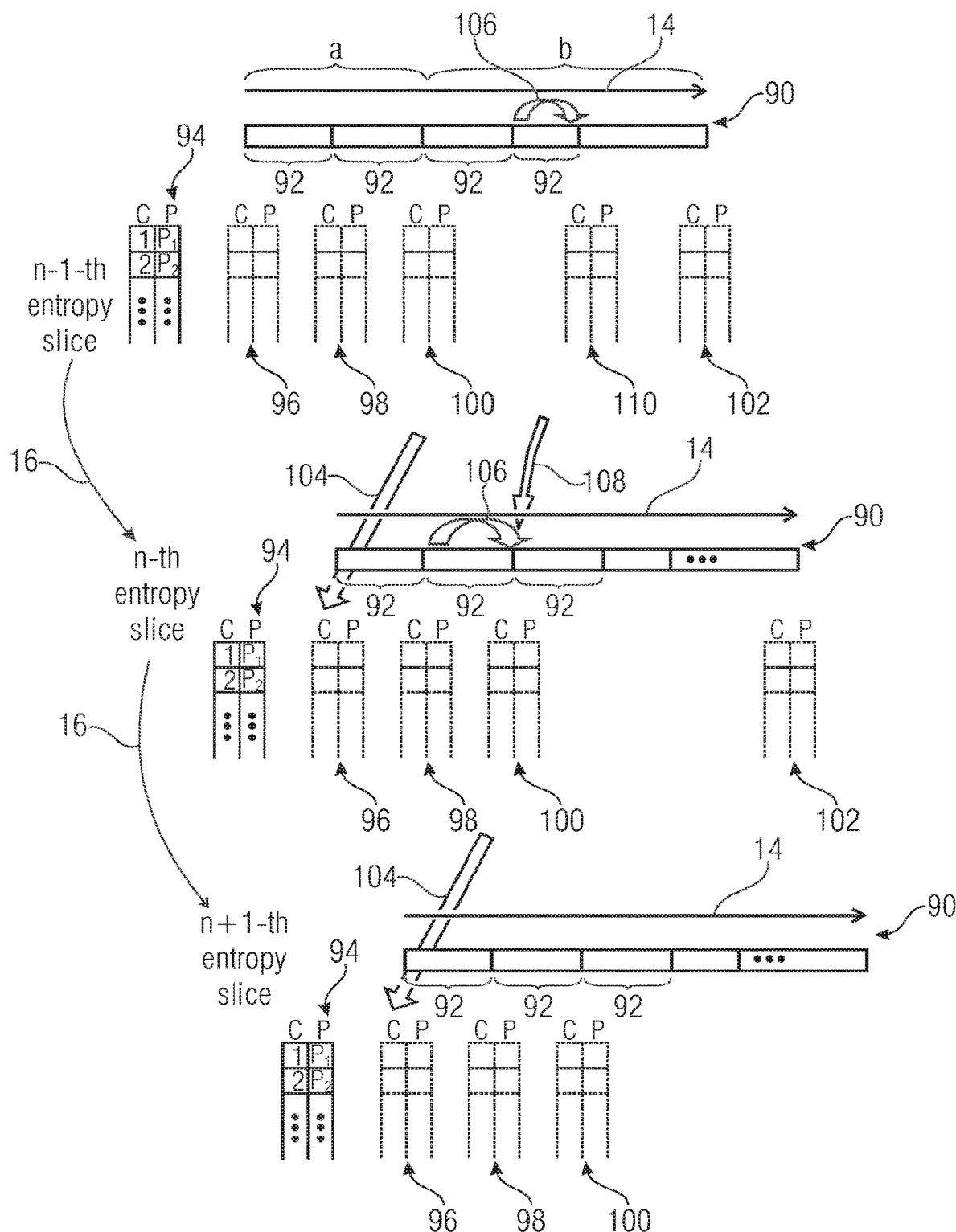
FIG. 4 shows a schematic diagram for explaining the functionality of an exemplary encoder such as the one of FIG. 1.

In order to describe the aforementioned dependency more clearly, reference is made to FIG. 4. FIG. 4 illustrates, the n−1, n and n+1 th entropy slices in entropy slice order 16 with reference sign 90. Each entropy slice 90 encompasses the sequence of syntax elements describing the portion 12 of the sample array 10 which the respective entropy slice 90 is associated with. Along the entropy coding path 14, entropy slice 19 is segmented into a sequence of segments 92, each of which corresponds to a respective one of the coding units 50 of the portion 12 which entropy slice 90 relates to.

As described above, the probability estimations used in entropy coding the entropy slices 90 are continuously updated during the continuation phase 86 along the entropy coding path 14 so that the probability estimations increasingly better adapt the actual symbol statistics of the respective entropy slice 90—i.e. the probability estimations are associated with the respective entropy slice. While the probability estimations 94 used to entropy code the entropy slice 90 during the continuation phase 86, are continuously updated, in FIG. 4, merely states of the probability estimations 94 occurring at the start and end positions of segments 92 are illustrated and mentioned further below. In particular, the state prior to entropy coding the first segment 92 as initialized during the starting phase 84, is shown at 96, the state manifesting itself after coding the first segment is illustrated at 98, and the state manifesting itself after encoding the first two segments is indicated at 100. The same elements are shown in FIG. 4 also for the n−1 entropy slice in entropy slice order 16, and the following entropy slice, i.e. entropy slice n+1.

Now, in order to achieve the above-outlined dependency, the initial state 96 for entropy coding the n-th entropy slice 90 is set dependent on any intermediate state of the probability estimations 94 manifesting itself during encoding the preceding entropy slice n−1. "Intermediate state" shall denote any state of the probability estimations 94, excluding the initial state 96 and the final state manifesting itself after entropy coding the complete entropy slice n−1. By doing so, entropy coding the sequence of entropy slices 90 along the entropy slice order 16 may be parallelized with a degree of parallelization being determined by the ratio of the number of segments 92 preceding the state used for initialization of the probability estimations 94 for entropy coding the next entropy slice, i.e. a, and a number of segments 92 succeeding this stage, i.e. b. In particular, in FIG. 4, a is exemplarily set to be equal to, with the initialization, i.e. adaption of state 100 so as to set state 96 of current entropy slice to be equaled to state 100 of the preceding entropy slice, being illustrated by arrow 104.

By this measure, the entropy coding of any segment 92 following state 100 in entropy coding path order 14 would depend on the probability estimation 94 as adapted during the continuation phase 86 based on the preceding segments of the same entropy slice as well as the probability estimation as used in entropy coding the third segment 92 of the preceding entropy slice 90.

Accordingly, the entropy coding of the entropy slices 90 could be performed in parallel in a pipelined scheduling. The only restrictions imposed onto the time scheduling would be that the entropy coding of some entropy slice may begin merely after finishing the entropy coding of the a-th segment 92 of the preceding entropy slice. Entropy slices 90 immediately following each other in entropy slice order 16, are not subject to any other restrictions regarding time-alignment of the entropy coding procedure during the continuation phase 86.

In accordance with another embodiment, however, a stronger coupling is used, additionally and/or alternatively. In particular, as illustrated in FIG. 4 by representative arrows 106, the probability estimation adaptation during continuation phase 86 causes that the data of the coding unit corresponding to a certain segment 92 changes the probability estimations 94 from the state at the beginning of the respective segment 92 till the end of this segment 92, thereby improving the approximation of the actual symbol statistics as denoted above. That is, the adaptation 106 is performed for the entropy slice n−1 merely dependent on data of entropy slice n−1, and the same applies to the probability estimation adaptation 106 of entropy slice n, etc. For example, it would be possible to perform the initialization as explained above with respect to arrows 104 with performing the probability estimation adaptation 106 without any further interference between the entropy slices 90. However, in order to expedite the probability estimation approximation of the actual symbol statistics, probability estimation adaptation 106 of consecutive entropy slices may be coupled so that the probability estimation adaptation 106 of a preceding entropy slice n−1 also influences, or is taken into account, when adapting the probability estimation adaptation of a current entropy slice n. This is illustrated in FIG. 4 by an arrow 108 pointing from state 110 of the spatially neighboring probability estimations 94 for entropy coding the n−1-th entropy slice 90 to state 100 of the probability estimations 94 for entropy coding the n-the entropy slice 90. When using the above-outlined initialization of state 96, the probability adaptation coupling 108 may be, for example, used at any of the b probability estimation states manifesting themselves after entropy coding the b segments 92 of the preceding entropy slice. To be more precise, the probability estimations manifesting themselves after entropy coding the first segment 92 of the current entropy slice may be the result of the usual probability adaptation 106 and by taking into account 108 of the probability estimation states resulting from the probability estimation adaptation 106 during entropy coding the (a+1)-th segment 92 of the preceding entropy slice n−1. The "taking into account" may, for example, involve some averaging operation. An example will be further outlined below. In other words, state 98 of the probability estimations 94 for entropy coding the n-th entropy slice 90 at the beginning of entropy coding segment 92 thereof, may be the result of averaging the predecessor state 96 of the probability estimations 94 for entropy coding the current entropy slice n as adapted using adaptation 106, and the state before entropy coding the (a+1)-th segment 92 of the preceding entropy slice n−1 modified according to the probability adaptation 106. Analogously, state 100 may be the result of an averaging the result of the adaptation 106 performed during entropy coding the current entropy slice n and the result of the probability adaptation during entropy coding the (a+2)-th segment 92 of the preceding entropy slice n−1, etc.

More specifically, let
$p(n \rightarrow_{\{i,j\}})$, with i,j denoting the position of any coding unit (with (0,0) being the left, top and (I,J) the right, bottom position), $i \in \{1 \ldots I\}$ and $j \in \{1 \ldots J\}$, I being the number or columns, J being the number of rows and p( ) defining the path order 66,
$P_{\{i,j\}}$ the probability estimation used in entropy coding coding unit $\{i,j\}$; and
$T(P_{\{i,j\}})$ the result of the probability adaptation 106 of based on coding unit $\{i,j\}$;
Then, the probability estimations 106 of consecutive entropy slices 90 may be combined to replace the usual, entropy slice internal adaptation according to $P_{p(n+1)} = T(P_{p(n)})$, by $$P_{p(n+1)} = \text{average}(T(P_{p(n)}), T(P_{\{i,j\}1}), \ldots, T(P_{\{i,j\}N}))$$

where N may be 1 or more than 1 and $\{i,j\}_{1 \ldots N}$ is/are selected from (lie within) any previous (in entropy slice order 16) entropy slice 90 and its associated portion 12, respectively. The function "average" may be one of a weighted sum, a median function, etc. $p(n)=\{i,j\}$ is the current coding unit and $p(n+1)$ follows in accordance with the coding order 14 and 66, respectively. In the presented embodiments $p(n+1)=\{i+1,j\}$.

Advantageously, $\{i,j\}_{1 \ldots N}$ fulfill, for each $k \in \{1 \ldots N\}$, $\{i,j\}_{1 \ldots N} = \{i_k, j_k\}$ and $i_k < i+3$ and $j_k < j$ with $p(n)=\{i,j\}$ being the current coding unit (i.e. any of the second or following coding units of the current entropy slice), i.e. they do not lie beyond the wavefront.

In the latter alternative, the entropy coding time scheduling when entropy coding the entropy slices 90 in parallel, is more closely coupled to each other. That is, during the continuation phase 86, the next segment 92 in line of a current entropy slice, may merely be commenced upon finishing the corresponding segment of the preceding entropy slice which is a ranking position further in entropy coding path order 14.

In other words, the above discussion showed an example where the decoder 40, and in particular, the entropy coding stage 44, is configured to perform, for an entropy slice 90 such as the n-th, an initialization of its probability estimations 94 before decoding the first segment 92 corresponding to the first coding unit/first block 50 of the portion 12 corresponding to the n-th entropy slice along the respective encoding path 14 with probability estimations manifesting themselves after having entropy decoded the second coding unit/block 50 of the portion 12 corresponding to the, in entropy slice order 16, preceding entropy slice along the respective encoding path 14. Additionally, or alternatively, the decoder 40 and, in particular, entropy coding stage 44, may be configured to perform, for each entropy slice 90, the entropy decoding and probability estimation adaptation such that, after a current part/block/coding unit 50 of the current entropy slice has been entropy decoded based on the respective probability estimations 94 of the current entropy slice 90, the respective probability estimations 94 of the current entropy slice are adapted depending on this current part of the current entropy slice and the probability estimations as manifesting themselves in entropy decoding a neighboring part/block/coding unit 50 of the spatially neighboring, preceding entropy slice, such as the one in the above neighboring row in the second column to the right of the current part/block/coding unit of the current entropy slice.

Figure 5:
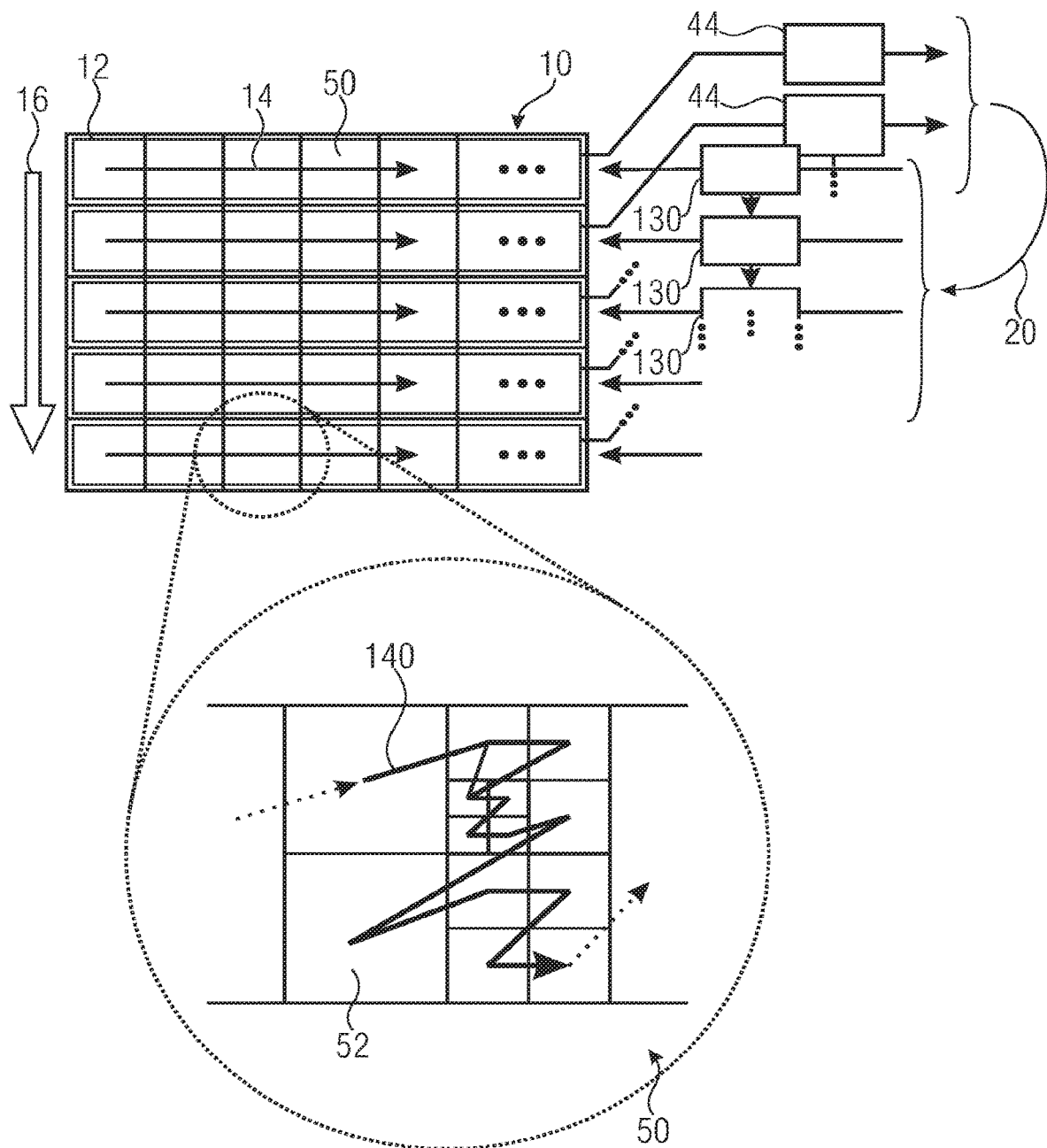
FIG. 5 shows a schematic diagram for a parallel operational implementation of encoder and decoder.

As became clear from the above discussion, probability estimation has to be adapted/managed for each entropy slice 50 separately. This may be done by sequentially processing the entropy slices and storing probability estimation states as those exemplarily shown and mentioned with respect to FIG. 4, i.e. 96, 98, 100, 110 and 102, in a respective probability estimation storage 120 (see FIG. 1). Alternatively, more than one entropy coding stage 44 may be provided so as to decode the entropy slices in parallel. This is illustrated in FIG. 5, where a plurality of instantiations of the entropy coding stage 44 are shown, each associated with a respective one of the entropy slices and corresponding portions 12 of the sample array 10, respectively. FIG. 5 also illustrates the decoding process and its possible implementations by using parallel instantiations of respective entropy decoding stages 130. Each of these entropy decoding stages 130 is fed with a respective one of the entropy slices conveyed via the data stream 20.

FIG. 5 shows that the entropy coding stages 44 and the respective decoding stages 130 do not completely operate independent of each other in parallel. Rather, stored probability estimation states such as the ones stored in storage 120, are passed from one stage corresponding to a respective entropy slice, to another stage relating to an entropy slice following in accordance with the entropy slice order 16.

FIG. 5 shows for illustration purposes, also a possible traversing order for traversing possible subdivisions of the coding units 50 such as a traversal order 140 defined among the prediction blocks 52 within one coding unit 50. For all these prediction blocks 52 corresponding syntax elements are contained within the respective segment 92 and corresponding to the values of these syntax elements, the probability estimations 94 are adapted during the traversal of path 140 with the adaptation during traversing coding unit 50 defining the above-mentioned "T". In CABAC according to H.264 and HEVC, "T" is performed table-based, i.e. by a "table walk" defining transitions from a current state of the probability estimation for a current context to a next state depending on the current symbol value associated with that context.

Figure 6:
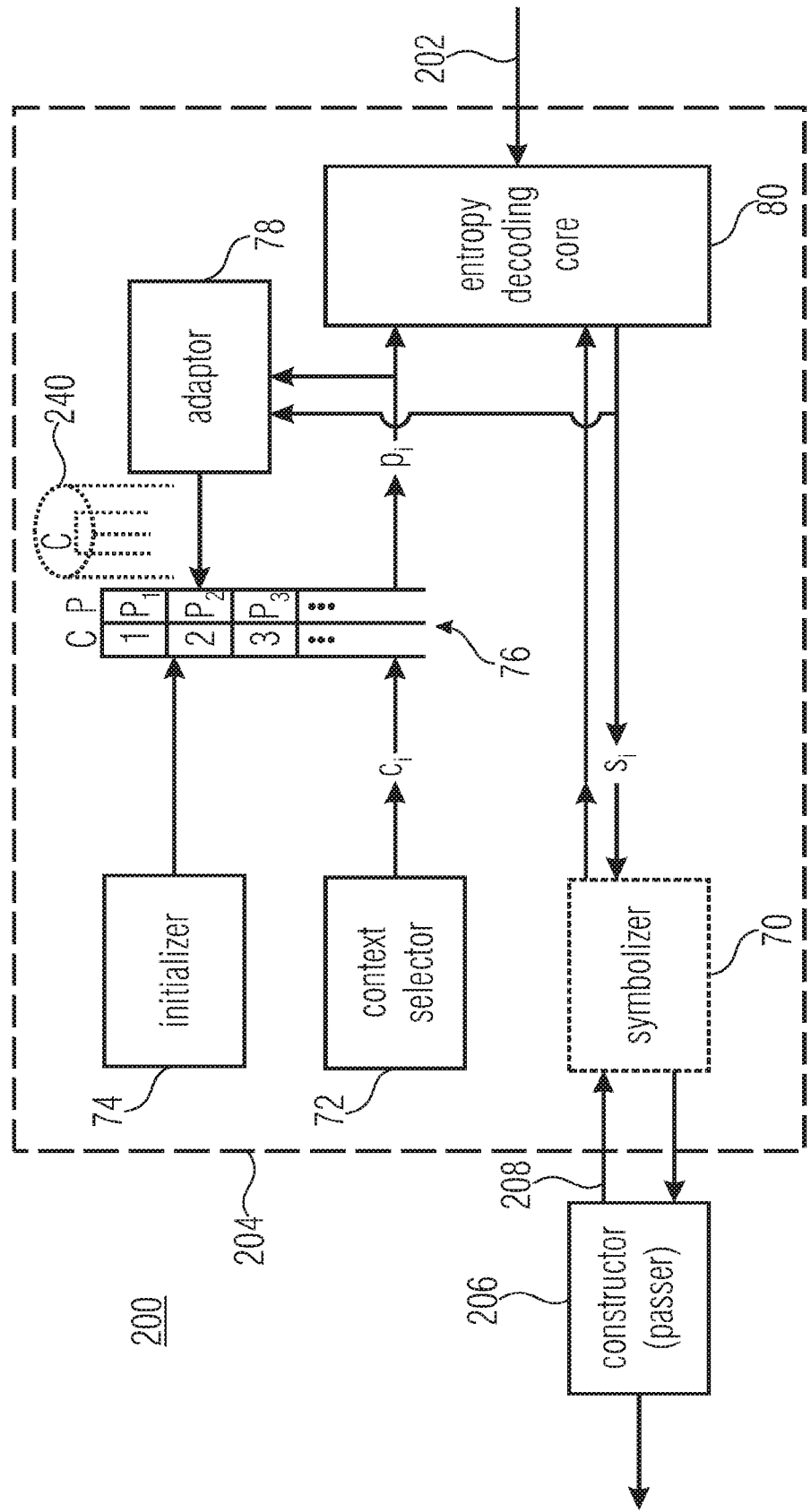
FIG. 6 shows a block diagram of an exemplary decoder.
Figure 7:
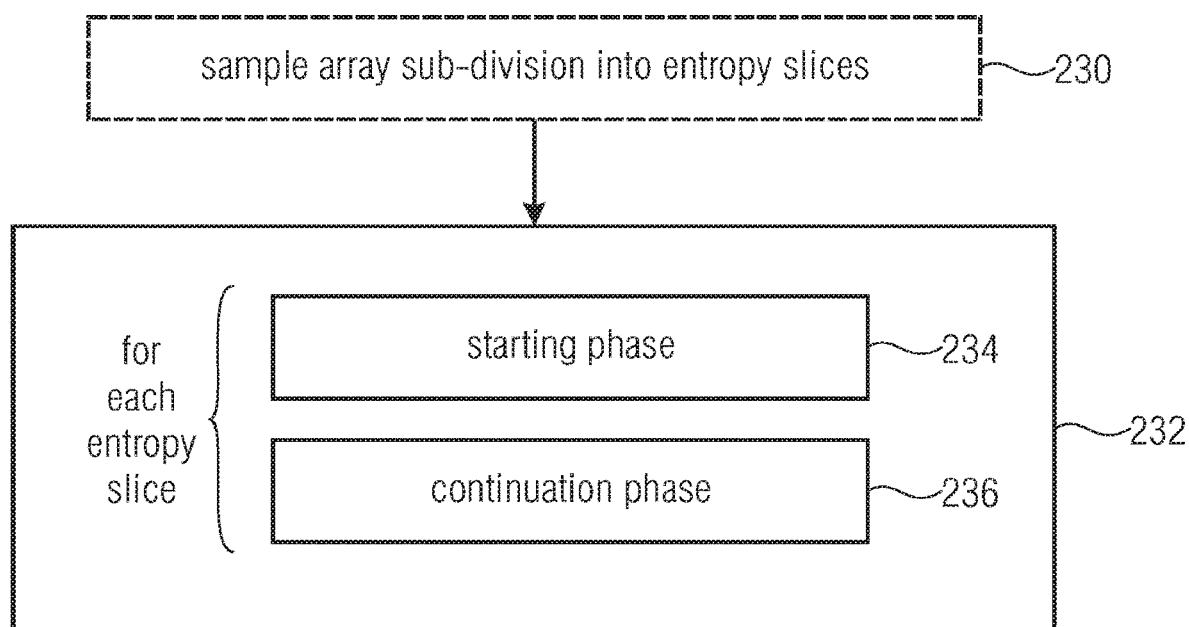
FIG. 7 shows a flow diagram of functionality of an exemplary decoder such as the one of FIG. 6.

Before proceeding with FIG. 6 showing a decoder embodiment corresponding to the encoder embodiment of FIG. 1, it should be noted that the predictive nature of precoder 42 merely served as an illustrative embodiment. In accordance with even alternative embodiments, the precoder 42 may be left off with the syntax elements which the entropy coding stage 44 operates on, being, for example, the original sample values of the sample array 10. Even alternatively, the precoder 42 may be configured to form a subband decomposition of sample array 10 such as in JPEG. The optional nature of context selector 72 has already been mentioned above. The same applies with respect to the initializer 74. The same may be instrumented differently.

FIG. 6 shows a decoder 200 corresponding to the encoder 40 of FIG. 1. It is visible from FIG. 6 that the construction of decoder 200 substantially mirrors the construction of the encoder 40. That is, decoder 200 comprises an input 202 for receiving data stream 20, followed by a concatenation of entropy decoding stage 204 and a constructor 206. The entropy decoding stage 204 entropy decodes the entropy slices conveyed to within data stream 202 and forwards, in turn, the decoded symbols $s_i$ and syntax elements, respectively, to constructor 206, which, in turn, requests the syntax elements from entropy decoding stage 204 by respective request 208. In other words, constructor 206 also assumes responsibility for parsing the syntax element stream produced by precoder 42 within the encoder. Accordingly, constructor 206 requests sequentially the syntax elements from entropy decoding stage 204. Entropy decoding stage 204 is structured substantially the same way as entropy encoding stage 44 is. Accordingly, the same reference signs of the internal blocks of entropy decoding stage 204 are re-used. The symbolizer 70, if present, turns the requests for syntax elements into requests for symbols and the entropy decoding core 80 answers with a respective symbol value $s_i$, symbolizer 70 maps sequences of received symbols forming valid symbol words into syntax elements and forwards same to constructor 206. Constructor 206 reconstructs the sample array 10 from the syntax element stream received from entropy decoding stage 204 such as, as outlined above, using predictive decoding, etc. To be more precise, constructor 206 also uses the coding order 66 and performs the decoding coding-unit-wise with performing predictions 60, 62 and 64. The one or more predictions for syntax elements or for sample values are combined such as added-up, optionally with using a prediction residual obtained from the syntax elements of the syntax element stream. The entropy decoding core 80 may, just as the entropy coding core 80, follow an arithmetic decoding concept or a probability interval partitioning entropy decoding concept. In the case of arithmetic decoding, entropy decoding core 80 may continuously update an internal state in form of a partial interval width value and a value such as an offset value, pointing into this partial interval. The update is done using the inbound data stream. The current partial interval is subdivided analogously to the entropy coding core 80 using the probability estimation $p_i$ provided for each symbol $s_i$ by way of context selector 72 along with probability estimation manager 76. The adapter 78 performs the probability estimation adaptation using the decoded symbol values $s_i$ in order to update the probability estimation values $p_i$ of the context $c_i$ associated with the symbol $s_i$ by context selector 72. The initializations by initializer 74 are done at the same instances and in the same way as in the encoding side.

Figure 8:
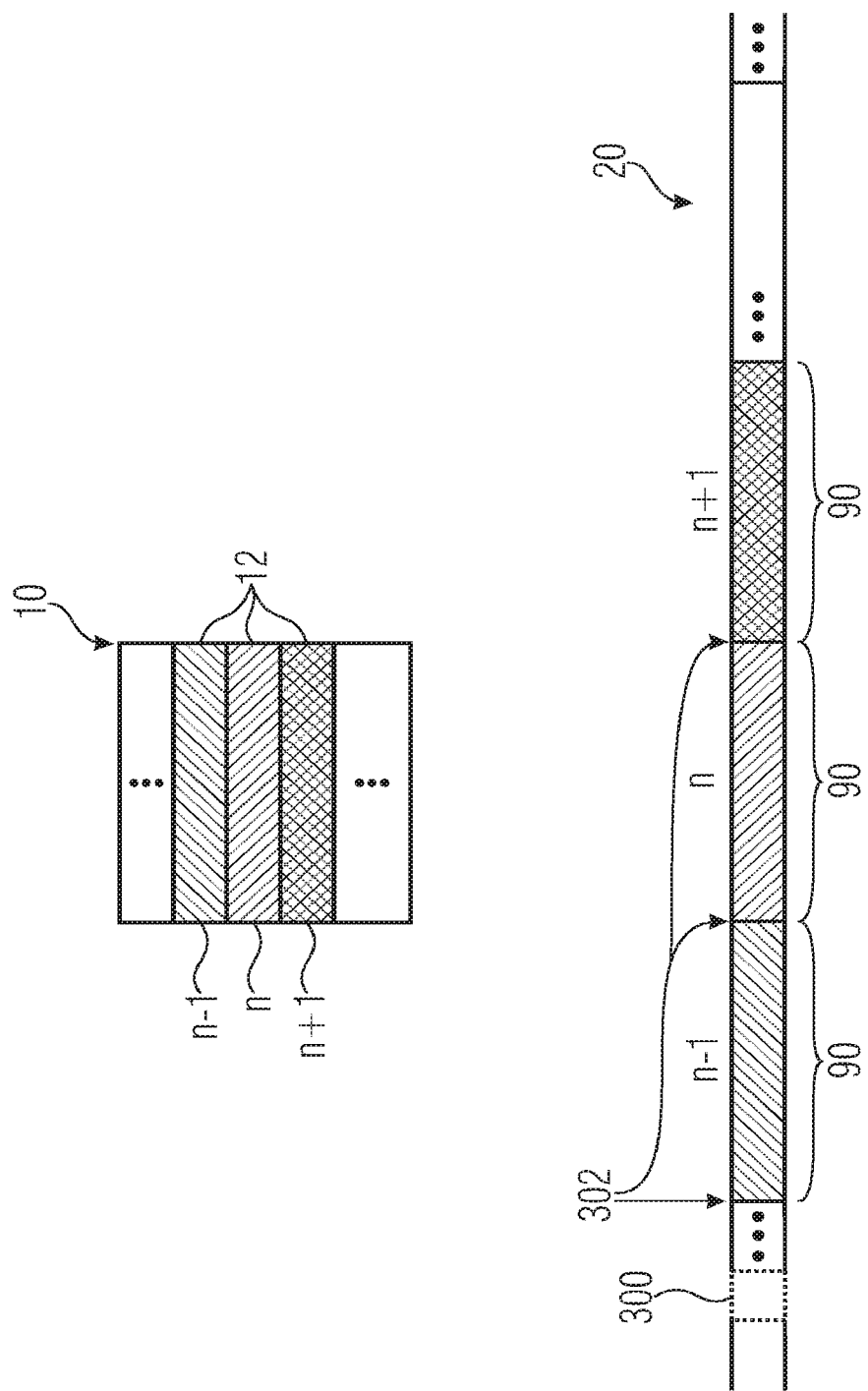
FIG. 8 shows a schematic diagram for an exemplary bitstream resulting from the coding scheme of FIGS. 1 to 6.

The decoder of FIG. 6 operates in a manner very similar to the functionality of the encoder as described above with respect to FIG. 3. In a step 230, the sample array 10 is subdivided into entropy slices. See, for example, FIG. 8. FIG. 8 shows the data stream 20 arriving at input 202 and in particular, entropy slices 90, contained therein. In step 230, each of these entropy slices 90 is associated with a portion 12 which the respective entropy slice 90 is associated with so that the above-described probability estimation initialization and probability estimation adaptation based on the respective proceeding entropy slice may be performed. The sample array subdivision, or, more precisely stated, the association of the entropy slices 90 with their respective portions 12, may be performed by constructor 206. The association may be achieved by different measures, such as side information contained within data stream 20 in portions not entropy coded, or by convention.

The entropy slices 90 are then, in the entropy decoding process 232, entropy decoded in a manner, mirroring the encoding process 82, namely with performing for each entropy slice 90, a starting phase 234 and a continuation phase 236 with probability estimation initialization and adaptation in the same manner and at the same instances as in the encoding procedure.

The same parallelization as described above with respect to the encoding, is possible at the decoding side. The entropy decoding stage instantiations 130 shown in FIG. 5 may each be embodied as shown with respect to the entropy decoding stage 204 in FIG. 6. A probability estimation storage 240 may be used in order to store states of the probability estimations for use in an entropy decoding stage 130 responsible for the entropy decoding of a subsequent entropy slice in entropy coding order 16.

After having described embodiments of the present application, the concepts discussed so far are described in the following, again using a different wording. Thereinafter, several further aspects of the present application are described. In the following, the aforementioned coding units 50 are called LCU (largest coding unit), thereby adapting the wording to the upcoming HEVC standard.

Firstly, the above-discussed probability adaptation 106 is briefly discussed again with respect to FIG. 9.

A current LCU uses the probability estimations such as CABAC probabilities, available after coding the preceding left LCU. For example, the LCU of FIG. 9, indicated with x, is supposed to be entropy coded using the probability estimation $p_i$ as adapted until the end of entropy coding the left-hand side LCU to the left of LCUx. However, if the information is used not only from the left one, but also from one or more other LCUs, which already have been processed and are available, better results in probability adaptation can be achieved.

As described above, in entropy decoding and entropy encoding the entropy slices, new probability estimations are computed before encoding or decoding of each LCU, with the help of already existing probabilities (probability estimations) from other LCUs. To be more precise, the probability adaptation is not only performed from any preceding LCUs of the current entropy slice, but also from LCUs of entropy slices preceding an entropy slice order. This approach is represented in FIG. 9 again. The start probability of the current LCU which is denoted X in FIG. 9, can be computed accordingly:

$$p_{new} = a_1 \cdot p_1 + a_2 \cdot p_2 + a_3 \cdot p_3 + a_4 \cdot p_4 + a_5 \cdot p_5 + a_{(5+1)} \cdot p_{(5+1)} \cdots + a_k \cdot p_k, \quad (1)$$

where $a_1, \ldots a_k$ are the weighting factors of the LCUs.

It has been tested which weighting of probabilities provide the best results. In this experiment only the neighboring LCUs have been used. The study reveals to use the weighting: 75% from the left LCU and 25% from the above-right LCU. In FIGS. 10-13, the results are presented. The graphs entitled using "prob. Adapt." use the probability adaptation described above.

Figure 9:
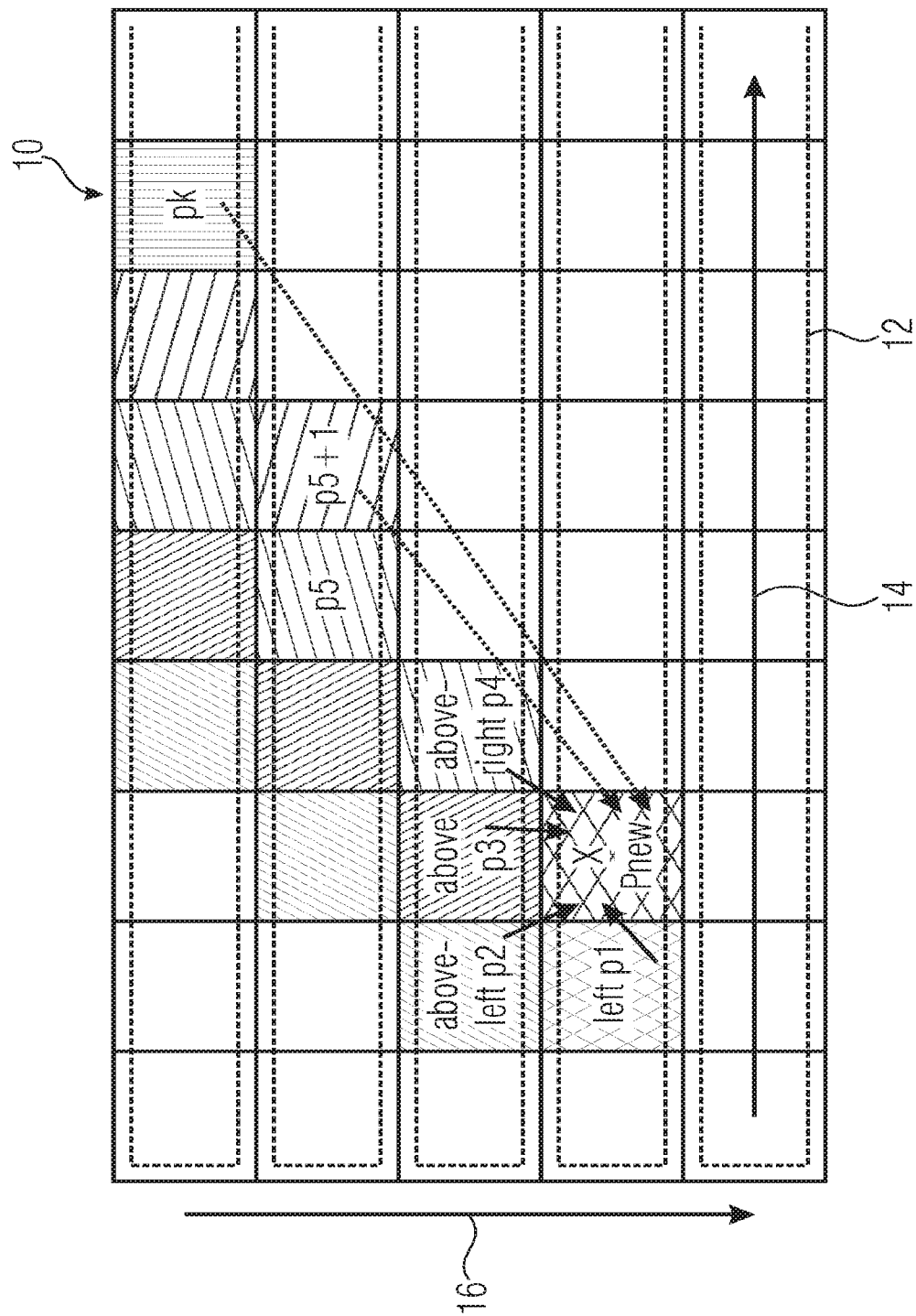
FIG. 9 schematically shows an example for how to compute probability with the help of others LCUs.
Figure 10:
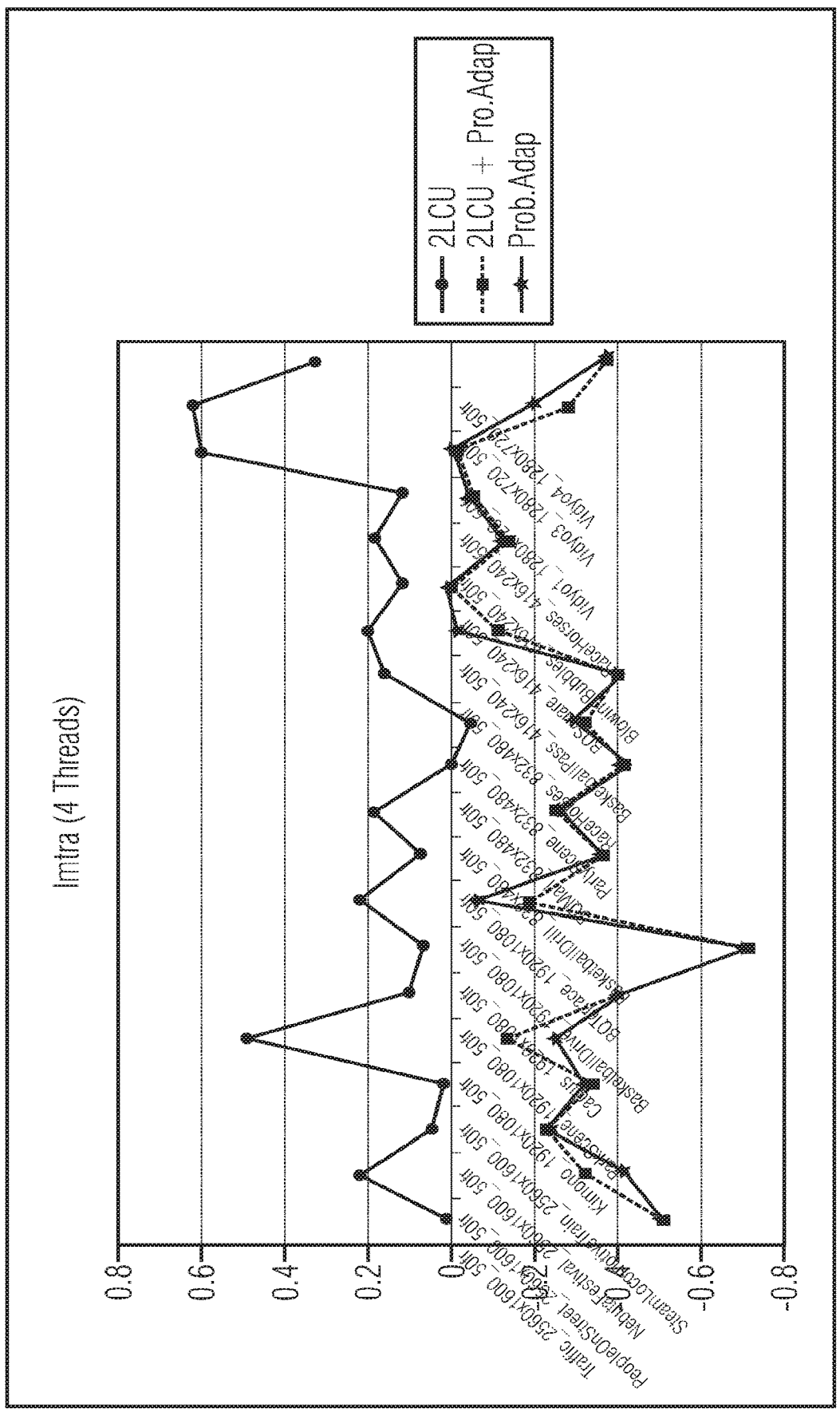
FIG. 10 shows a graph illustrating the RD results for Intra (4 Threads), in a comparison with HM3.0.
Figure 11:
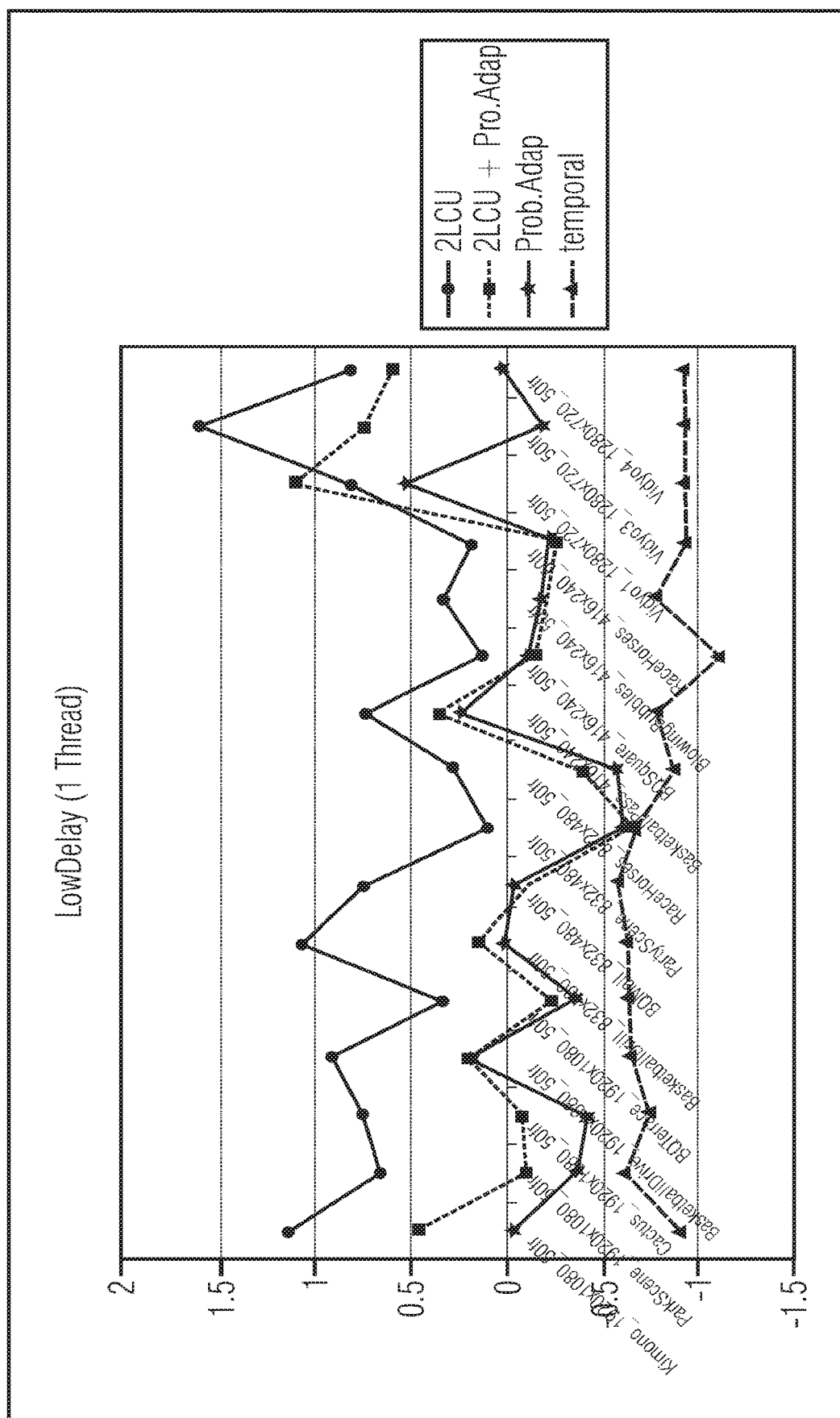
FIG. 11 shows a graph illustrating the RD results for Low Delay (1 Thread), in a comparison with HM3.0.
Figure 12:
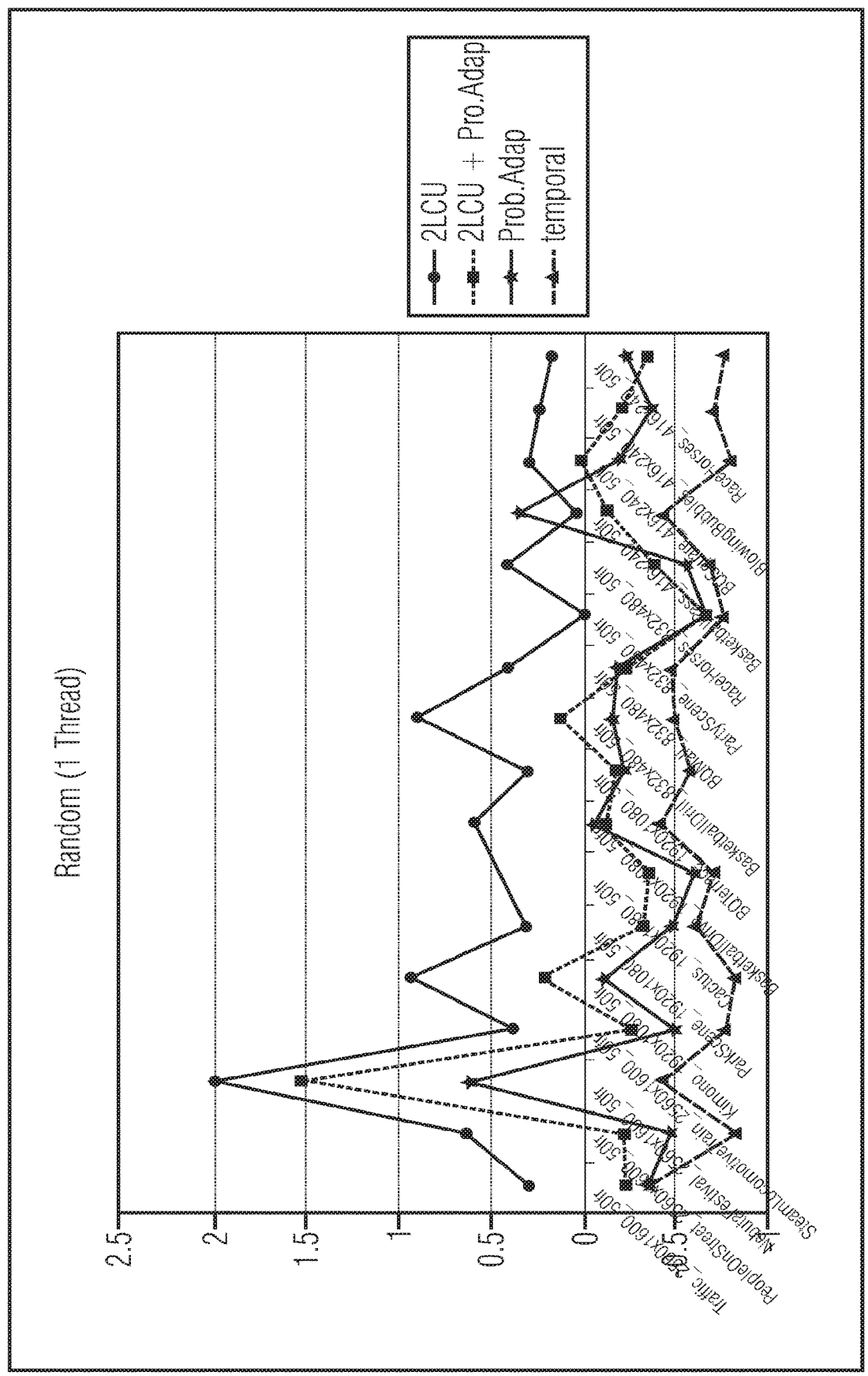
FIG. 12 shows a graph illustrating the RD results for Random Access (1 Thread), in a comparison with HM3.0.
Figure 13:
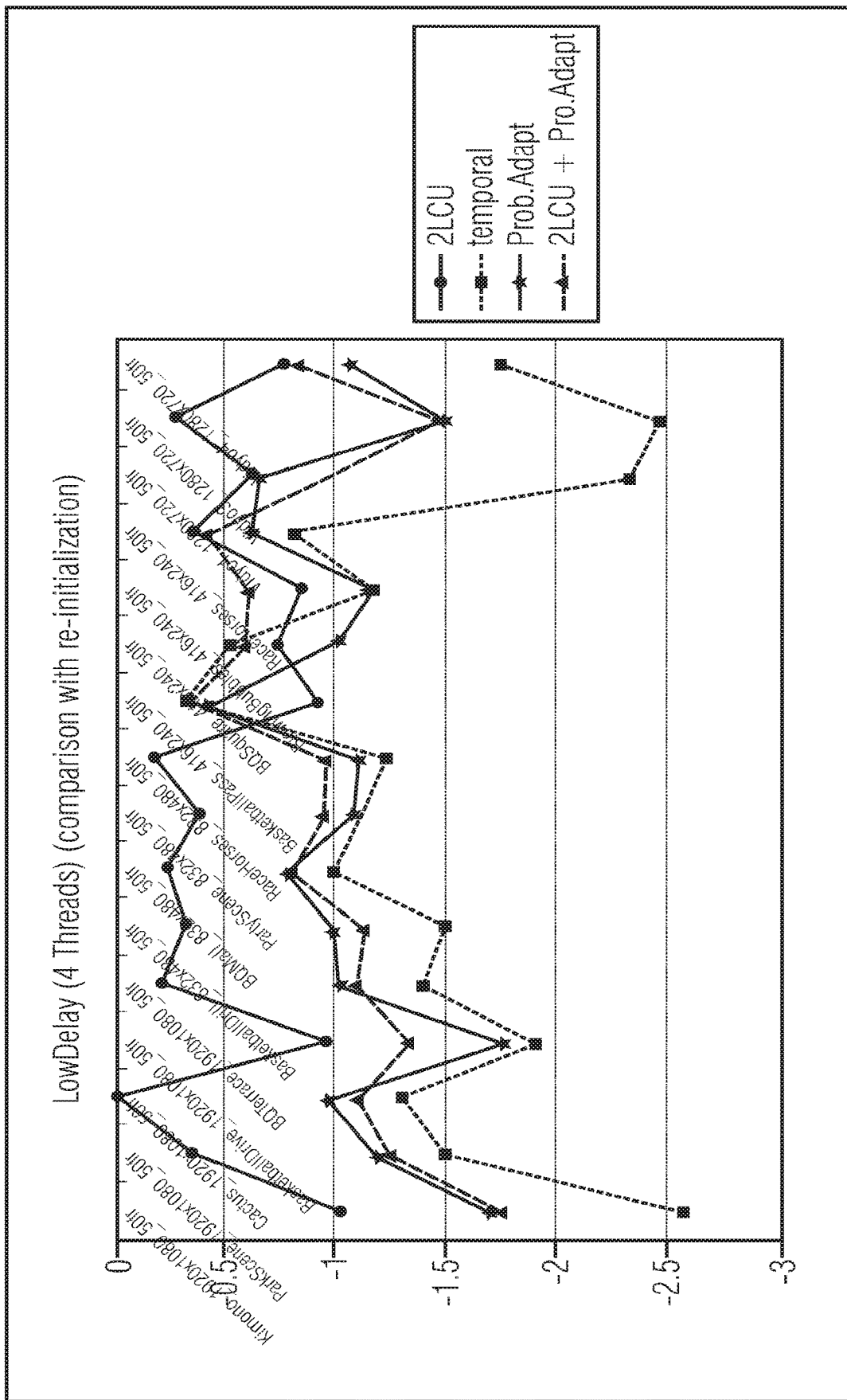
FIG. 13 shows a graph illustrating the RD results for LowDelay (4 Threads), in a comparison with HM3.0.

However, in the probability estimation adaptation, not only adjacent blocks can be used. Each nearest LCU has peculiarly own neighbors, whose use for probability optimization may be significant. In other words, not only the LCUs from the upper nearest row can be applied. In FIG. 9, one can see an example where the derivations of the probability estimations have been taken first from the neighbors and can be taken from each above-right LCU of each next upper row, cf. $p_5$ and $p_k$.

It should be admitted that some complexity is introduced by the above outlined probability recalculation or probability estimation adaptation. New computation of probability estimation occurs, for example, in three steps: at first, probability estimations of each candidate have to be gained from each context state. This is done by storing in storage 120 and 240, respectively, or by steering the parallel entropy slice n/decoding processes such that these states are available concurrently. Secondly, by using the equation (1), optimized probability ($p_{new}$) will be created. That is, some averaging, for example, may be used in order to combine adapted probability estimations of different entropy slices. As a last step, a new context state is converted from $p_{new}$ and replaces the old one. That is, probability estimation manager 76 adopts the new probability estimations thus obtained. This performance for each syntax element, particularly using multiplication operations, can increase complexity enormously. The only way to reduce this penalty is to try to avoid these three steps. If the number of candidates and their weightings are determined, a pre-calculated table for each situation can be approximated. Thus, only one simple access to the table dates with the help of candidates' indices (context states) is needed.

It is asserted that this technique can provide good results for both applications using and not using entropy slices. The first application uses only one slice per frame, thus probability adaptation is optimized without any other changes. In case of entropy slices, the adaptation of the probabilities occurs within each slice independent from other slices. This allows for fast learning of the probabilities of the current LCU.

In the above description, the usage of the second LCU of the upper line was also presented, i.e. the usage of the second LCU for probability estimation initialization. Parallelization of encoding and decoding is possible, if some conditions of the bitstream that have been mentioned above (entropy slices) are accomplished. The CABAC probabilities dependency between LCUs must be broken. By the Wavefront Parallel Processing is important to make the first LCU of each line independent from the last LCU of the previous line. It can be achieved if, for instance, the CABAC probabilities are re-initialized at the beginning of each line of LCUs. However, this method is not optimal, because each re-initialization loses the achieved CABAC probabilities, which are adapted to the specificities of the image. This penalty can be reduced, if the initialization of the CABAC probabilities of the first LCU of each line is occurred with the probabilities obtained after the second LCU of the previous line.

As has been described above, a gain in probability adaptation speed is achievable by coupling the probability adaptations of spatially neighboring entropy slices. In particular, in other words, above discussion also anticipates a decoder such as the one of FIG. 6 for reconstructing a sample array (10) from an entropy encoded data stream, configured to entropy decode (performed by the entropy decoding stage) a plurality of entropy slices within the entropy encoder data stream so as to reconstruct different portions (12) of the sample array associated with the entropy slices, respectively, with performing, for each entropy slice, the entropy decoding along a respective entropy coding path (14) using respective probability estimations, adapting (performed by the adaptor 78) the respective probability estimations along the respective entropy coding path using a previously decoded part of the respective entropy slice, starting the entropy decoding the plurality of entropy slices sequentially using an entropy slice order (16), and performing, in entropy decoding a predetermined entropy slice, entropy decoding a current part (x) of the predetermined entropy slice based on the respective probability estimations of the predetermined entropy slice as adapted using the previously decoded part of the predetermined entropy slice (including p1, for example), and probability estimations as used in the entropy decoding of a spatially neighboring, in entropy slice order preceding entropy slice (the slice comprising X, for example) at a neighboring part (such as p4) of the spatially neighboring entropy slice.

The different portions may be rows of blocks (e.g. LCUs or macroblocks) of the sample array. The latter may be a picture of a video. The entropy coding path may extend row-wise. The entropy coding, and thus, the probability adaptation as well, may be context adaptive. The entropy slice order may generally be chosen such that, along the entropy slice order, the different portions follow each other in a direction (16) angled relative to the entropy coding paths (14) of the entropy slices, which, in turn, extend substantially in parallel to each other. By this measure, a "wavefront" of currently decoded parts (such as p1, p4, p5+1 and pk in the figure) of the entropy slices may generally be arranged along a line forming an angle to the entropy slice paths smaller than the sequence direction of the portions. The wavefront may have to have a slope of 1y per 2x block positions in order for the upper left reference to be there, for all threads processing slices in parallel.

The decoder may be configured to perform, for each entropy slice, the entropy decoding along the respective entropy coding path in units of parts of the sample array portion of the respective entropy slice so that the entropy slices consist of the same number of parts, respectively, and the sequence of parts of the portions along the entropy slice paths are aligned to each other in a direction lateral to the entropy slice paths. The current part of the portion of the predetermined entropy slice belongs to the resulting grid of parts (e.g. LCUs or macroblocks). In performing, for each entropy slice, the entropy decoding along a respective entropy coding path, the decoder may preserve offsets/shifts between starting times between immediately consecutive entropy slices in entropy slice order so that the wavefront of currently decoded parts of the entropy slices forms a diagonal such as up to a line with slope of 0.5× block positions with respect to entropy slice paths and entropy slice order direction. The offset/shift may correspond to two parts for all pairs of immediately consecutive entropy slices. Alternatively, the decoder may merely prevent the distance of currently decoded parts of immediately consecutive (and immediately neighboring as far as their sample array portions 12 are concerned) entropy slices to become lower than two parts. See, the figure above: as soon as the part/block p4 has been decoded, the part/block to the right thereof is decoded according to path order 16, and concurrently, if any, X is decoded or any of the parts/blocks preceding the same). By this measure, the decoder may use the probability estimates as already adapted based on the content of part/block p4, i.e. the part within the spatially neighboring portion, being aligned to the part of the portion 12 of the predetermined entropy slice succeeding the current part X in path order 16, in order to determine the probability estimates to be used in decoding X. In case of a constant offset in decoding the immediately entropy slices of two parts, the decoder is able to use the probability estimates as already adapted based on the content of part/block p4 concurrently for entropy decoding the subsequent part (i.e. the part to the right of p4) of the spatially neighboring entropy slice.

As described above, a weighted sum of the already adapted probability estimations may be used in order to determine the probability estimates to be used for decoding X.

As also described above, the entropy slice order may also go over frame boundaries.

It should be noted that the just-outlined probability adoption from the predecessor entropy slices may be performed for every part of the current/predetermined entropy slice for which such neighboring parts in the predecessor entropy slices are available. That is this is also true for the first part along the path direction 16, and for this very first part/block (the leftmost in each entropy slice in the figure) the adoption equals the initialization described above.

In order to better adapt, also in this case, the 2 above-mentioned methods can be combined together. The results of this process with 1 and 4 Threads, i.e. the parallel used processing units, are illustrated in FIG. 10-FIG. 13 (2LCU+ Prob.Adap or 2LCU graphs).

In order to better understand the context of the above embodiments and, especially, the further embodiments described below, in particular the use of LCUs, one may first have a look at the structure of H.264/AVC.

A coded video sequence in H.264/AVC consists of series of access units that are collected in the NAL unit stream and they use only one sequence parameter set. Each video sequence can be decoded independently. A coded sequence consists of a sequence of coded pictures. A coded frame can be an entire frame or a single field. Each picture is partitioned into fixed-size macroblocks (in HEVC: LCUs). Several macroblocks or LCUs can be merged together into one slice. A picture is therefore a collection of one or more slices. The goal of this data separation is to allow independent decoding of the samples in the area of the picture, which is represented by the slice, without the use of data from other slices.

Figure 14:
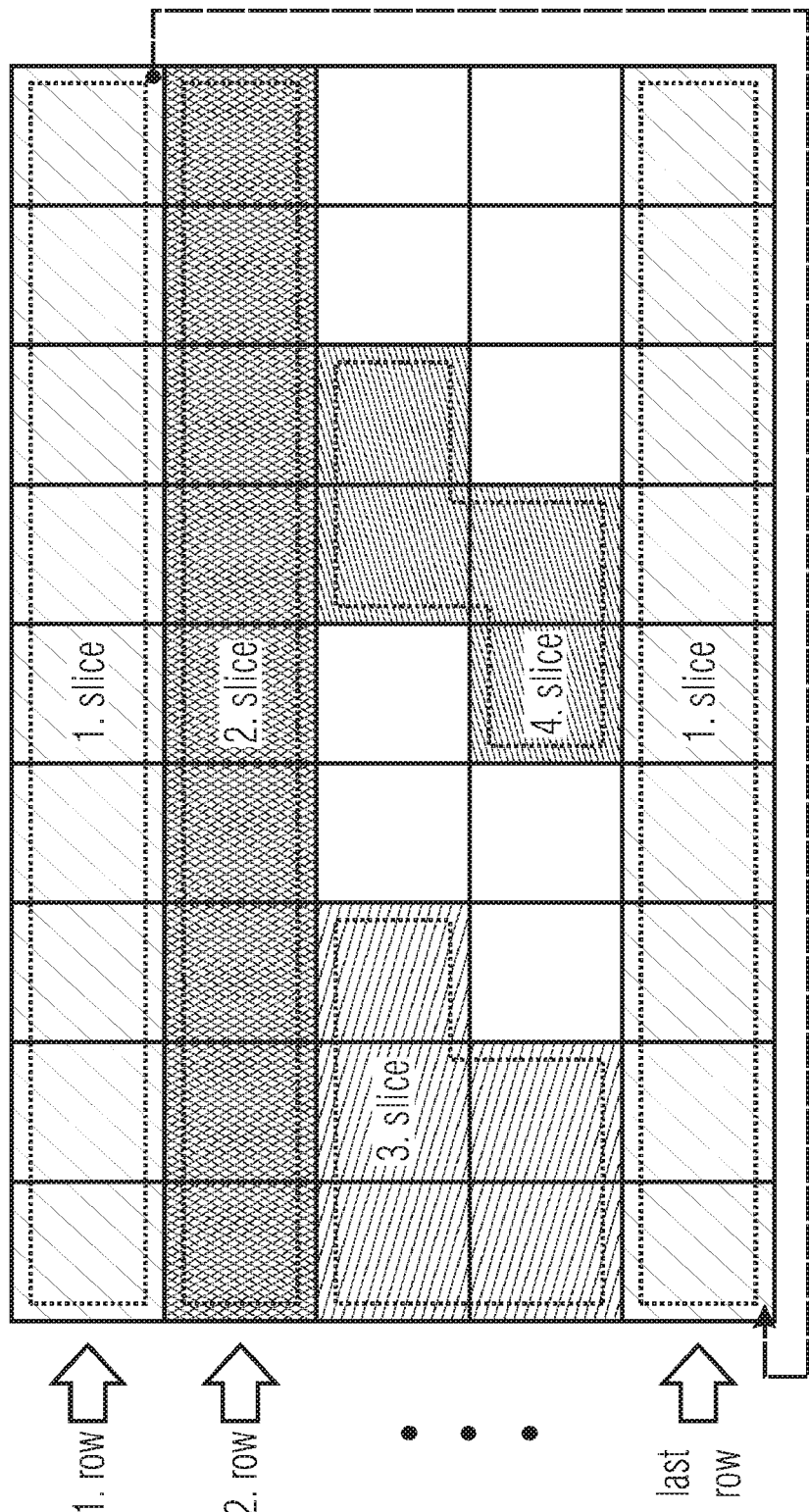
FIG. 14 schematically and exemplarily illustrates the possible compounds of entropy slices.

A technique that has also often referred to as "entropy slices" is a splitting of the traditional slice into additional sub-slices. Specifically, it means slicing of entropy coded data of a single slice. The arrangement of entropy slices in a slice may have different varieties. The simplest one is to use each row of LCUs/macroblocks in a frame as one entropy slice. Alternative, columns or separate regions can be utilized as entropy slices, which even can be interrupted and toggled with each other, e.g. slice 1 in FIG. 14.

An obvious aim of the entropy slice concept is to enable the use of parallel CPU/GPU and multi-core architectures in order to improve the time of the decoding process, i.e. to speed-up the process. The current slice can be divided into partitions that can be parsed and reconstructed without reference to other slice data. Although a couple of advantages can be achieved with the entropy slice approach, thereby emerging some penalties.

First of all, a main aim is to create a bitstream that is suitable for a parallel encoding and decoding process. One must take into account, that a LCU can be encoded only if the neighboring LCUs (left, top, top-right) are already available as coded version, in order to use spatial and motion information for prediction. To enable a parallelism by slicing, a shift between processing of slices must be realized (for example shift of 2 LCUs, as typical for the wavefront approach). Due to CABAC probabilities adaptation, an LCU use the probabilities that are available from the previous encoded LCU. In regard to raster scan order, the problem, which occurs by slicing the picture, is the prevention of parallelism, since the first LCU of each line depends on the last LCU of the previous line. On impact of this is that the CABAC probabilities dependencies between slices must be broken, so that several slices can be started simultaneously. One way to do this is the usual CABAC re-initialization whereby, however, all the adopted data will be lost. As a result, bitrate may increase.

Secondly, each slice generates its own sub-bitstream, which can be put in series into the main stream. But it is necessitated to pass decoder special information, so that these slices and their positions in the main stream can be correctly identified. Two scenarios for signaling are supported. The location information can be stored in the picture header (slices length information) or in each slice header (points as start code). Byte alignment at the end of each entropy slice and location information raise loss.

In order to reduce the penalty introduced by the signaling for entropy slices, it is essential to use a good coding technique for the signaling. A noticeable penalty for entropy slice signaling is introduced in a frame, if start codes are used for each slice, i.e. too much additional bytes (e.g. min. 4 bytes per slice) are added to the bitstream. Certainly, insertion of entropy slices 90 using start codes has the advantage in low delay scenarios where the encoder shall be able to instantaneously output entropy slices. In such cases, there is no up-front signaling of entry points possible.

Figure 15:
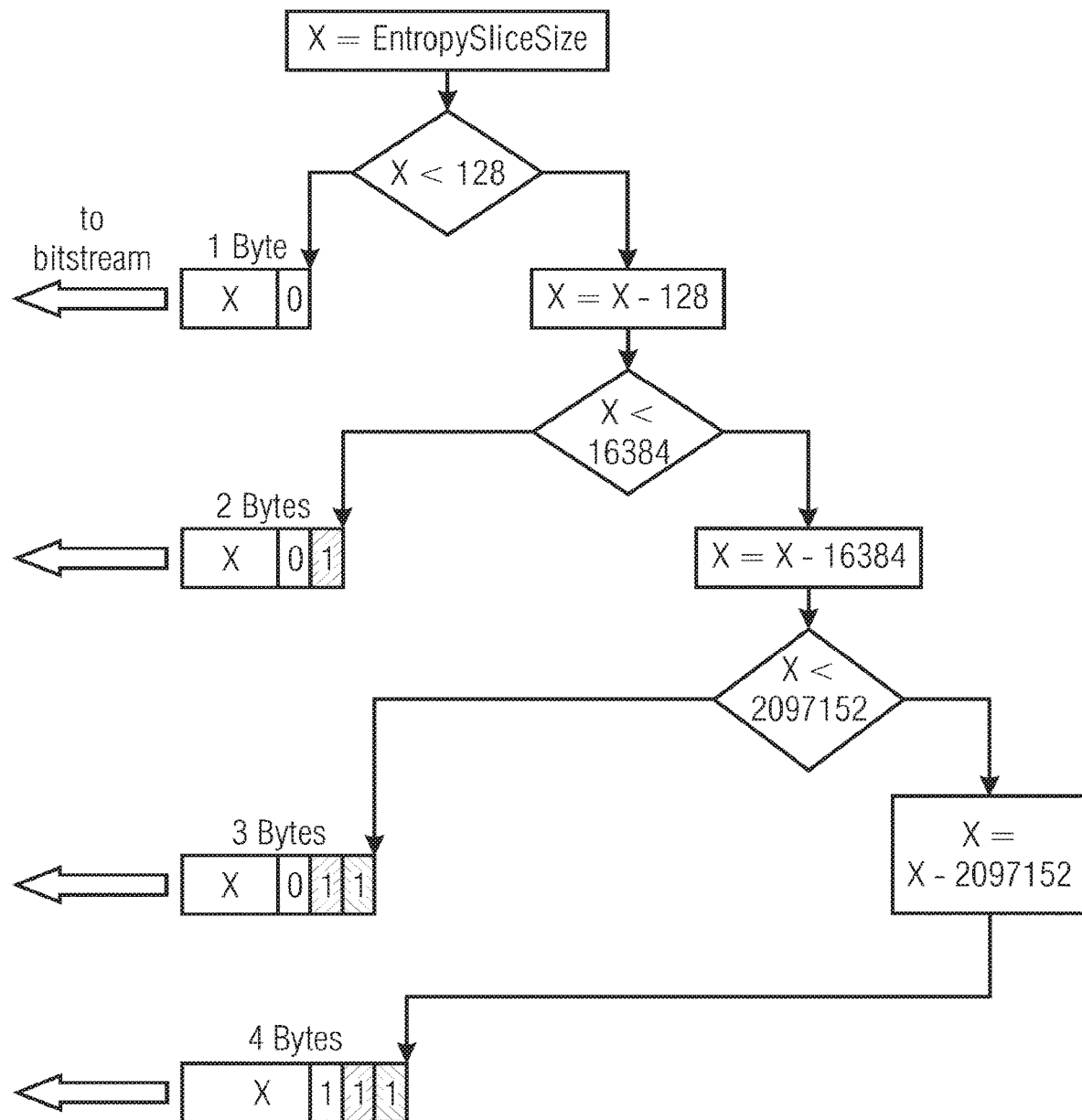
FIG. 15 schematically and exemplarily illustrates a possible signaling of an entropy slice.

In less low-delay strict scenarios, however, the opportunity to store slice lengths (offsets) seems more suitable. One well known method to code such information is Variable Length Code (VLC) or Exponential-Golomb coding. The main feature of VLC is adding empty information (zeros) before true information. With the help of these zeros, a code that stores information about offset length can be determined. We propose another technique to realize this, which schema is shown in FIG. 15, where X=EntropySliceSize is the amount of bytes contained in an entropy slice. Each next X (offset) is defined as a difference in the size between previous, already encoded and signaled, entropy slice offset and the current one. The main features of this concept are forming of differences, depending on size X, thus the amount of data can be diminished, and adding up to 3 bits, which allows extracting the proper information about size of each entropy slice by decoder. In comparison with VLC the saving bit quantity in the entropy slice header can be gained.

That is, in accordance with the aspect of FIG. 15, for example, a concept for entropy encoding an information signal is provided which enables higher compression rate despite parallel processing ability than compared to concepts available so far. In accordance with this aspect, an entropy encoded data stream section 20 into which a sample array is encoded, comprises entropy slices such as 90 in FIG. 8 into which different portions 12 of the sample array are entropy encoded, and a header illustrated with dashed lines 300 in FIG. 9, comprising information which reveals starting positions 302 of the entropy slices 90, measured in the entropy decoded domain, within the entropy-encoded data-stream, the information comprising, for a predetermined entropy slice, a difference value revealing a difference between a starting position of a preceding entropy slice n−1 and a starting position of the predetermined entropy slice n, the difference being included into the data stream as a VLC bit sequence.

In particular, the VLC bit sequence may have a prefix of variable length y, indicating that the difference x falls into the y-th of a sequence of a number z of intervals [0, 2a−1], [$2^a, 2^b+2^a−1$], [$2^b+2^a, 2^c+2^b+2a−1$] as so forth, and a PCM coded suffix of the y-th of the sequence of lengths a, b, c . . . If a, b, c, . . . are chosen to be a power of two, if the corresponding y is added, i.e. so that a+1, b+2, c+3 and so forth are all powers of two, then byte alignment may be preserved. The number z is not restricted to three as exemplarily chosen in FIG. 15.

The encoder, such as the one in FIG. 1, is appropriately designed to turn the difference of consecutive starting positions into a VLC bit sequence, i.e. by firstly determining the prefix, i.e. into which sub-interval the difference lies (the y-th), and then setting the suffix plus to be equal to the starting position difference minus the y-th of 0, $2^a$, $2^b+2^a$ as so forth. The decoder, such as in FIG. 6, is appropriately designed to derive the starting position of the current entropy slice n from the VLC bit sequence, i.e. by firstly inspecting the prefix to obtain y, then setting the difference to the value of the suffix plus the y-th of 0, $2^a$, $2^b+2^a$ as so forth, and then adding the difference to the starting point of the preceding entropy slice n−1.

A further advantage may be achieved by segmentation of entropy slices, namely for low-delay transmission and decoding speed-up.

In video-streaming, enabling of higher resolutions (Full-HD, QUAD-HD etc.) leads to higher amount of data that has to be transmitted. For time-sensitive scenarios, so called Low-Delay use-case (<145 ms), the transmission time becomes a critical factor. Consider the up-load link of ADSL for a video conferencing application. Here, so called random access points of stream, usually these refer to I-frames, will be the candidates to cause a bottleneck during transmission.

To solve that problem and to minimize the delay of transmission and decoding time, i.e. the end-to-end delay, a new technique for an interleaved entropy slice scheme for parallel transmission and processing may be applied.

HEVC will allow for so called Wavefront-processing at the decoder side. That is going to be enabled by use of entropy slices. In normal case the data of a whole slice will be delivered at one time. The decoding process will start as soon as encoded data is arrived at Wavefront-decoder-engines. To reduce the time when decoder can start and finish a frame, a segmentation of entropy slices into small chunks using an interleaving approach is used in accordance with the present embodiment. Hence the encoder can deliver data, correspondent to particular entropy slice, to transport layer earlier than in normal case. It results then in faster transmission and earlier start of a parallel decoding process at the client.

Creating chunks of a slice can be further achieved by sub-dividing an entropy slice in further slices keeping all dependencies (dependent slices). If done so in each Largest Coding Unit (LCU)/Coding tree unit (CTU), these chunks can be interleaved by additionally using system layer techniques which allow for transmitting the chunks in an interleaved form and recovering or at least providing the knowledge of the original decoding order of the chunks via additional signaling. Such signaling may be a decoding order number (DON), such as defined in the IETF RTP Payload Format for H.264/AVC (RFC 3984). Another system method may be to apply the chunks of a wavefront substream to a different transportstream, as in MEPG-2 Systems, by assigning a different PID to each of them, further multiplexing and by that interleaving them on the transport channel.

The approach may be also applied over frame boundaries, in case, if the following frame's slice(s) or entropy slice(s) can be already decoded, e.g. in wavefront manner, based on the knowledge that the necessitated information for decoding an entropy slice of a following frame due to the availability of inter-frame references. Those already decodable data of a frame succeeding in decoding order may be derived from the maximum allowed/signaled motion vector length or additional information in the stream indicating the dependencies of data parts to the preceding frame(s)), or a fixed referencing scheme, indicating the position signaled in a sequence-fixed position such as a parameter set. This will further be outlined below.

Picture may be encoded with one entropy slice per largest coding unit (LCU)-row(s) as depicted in FIGS. 2 and 9. It is advantageous for using of Wavefront-technique at decoder side. During the encoding process, bitstream of each slice may be divided into segments of constant size. Then the resulted segments are interleaved and can be passed to the transmission. The constant size of segments can bring a problem at the end of bitstream due to its variable length.

There are two general solutions possible. First one is a generation of one-byte segments (usually the bitstream representation of slice is byte-aligned) and controlling of consuming of bytes by each decoder-engine, i.e. the decoder finds out the completion of an entropy slice.

The second is using of finalizing code at the end of slice. In the last case, variable length segments are possible, but it can also lead to higher amount of data. Another method is the signaling of the entropy slice length. One way of such an alternative is described below The size of segment and interleaving mode can be signaled either in one SEI-Message or in SPS.

Figure 16:
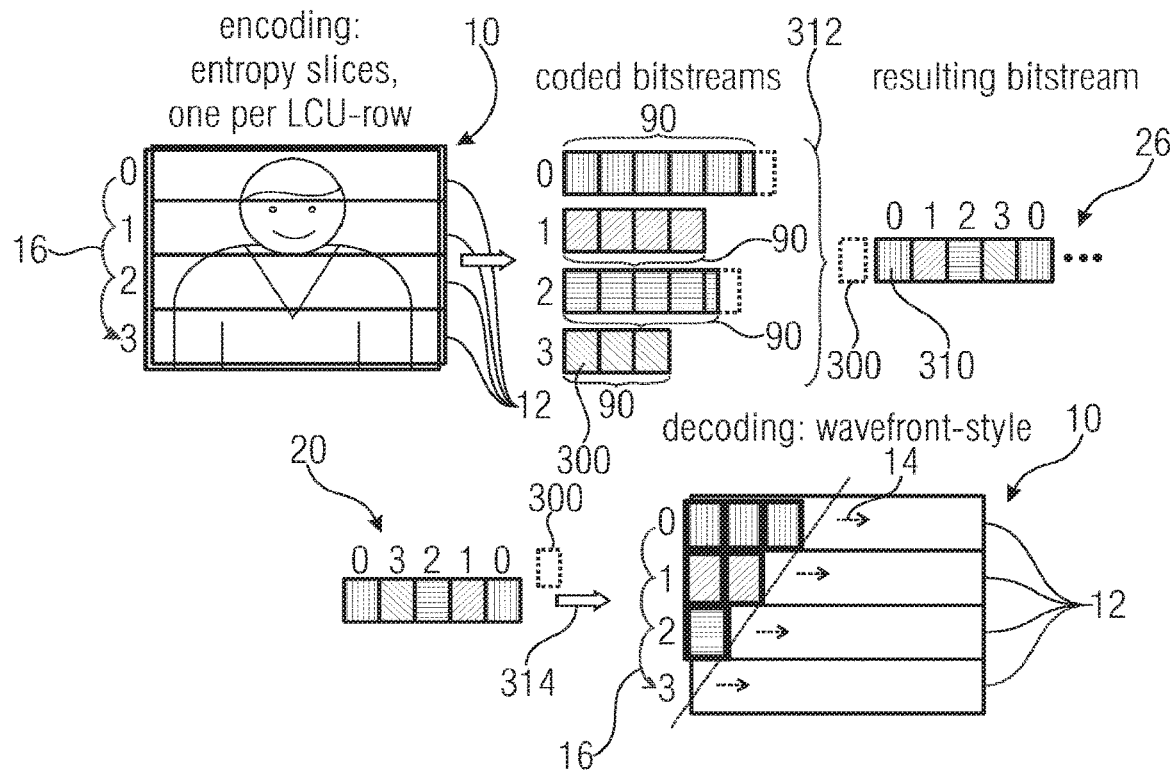
FIG. 16 schematically and exemplarily illustrates Encoding, segmentation, interleaving and decoding of entropy slice data via chunks.

The transmission scheme is shown in FIG. 16.

Thus, in accordance with the aspect of FIG. 16, for example, a concept for entropy encoding a sample array is provided which enables lower delay than compared to concepts available so far. In accordance with this aspect, an encoded data stream 20 into which an information signal is encoded, comprises slices such as entropy slices 90 or just fully independently decodable slices (shown at the left-hand side) into which different portions 12 of the information signal are (predictively and/or entropy) encoded, wherein the slices 90 are sub-divided into chunks (shaded boxes 310) which are arranged within the encoded data stream 20 in an interleaved manner (shown at the right-hand side), the interleaving being represented by bracket 312.

As denoted above and described with respect to the other aspects, the slices may be entropy slices 90 which, in turn, may be proper subsets of slices of frames, and accordingly, the encoded data stream may be an entropy encoded data stream 20.

The interleaving 312 of the slices 90 enables lower delay since the decoder responsible for decoding any of the slices 90 does not need to wait for a time duration consumed by previous slices of other decoders (according to slice order 16). Rather, all available decoders are able to begin decoding their associated slices as soon as the first chunk 310 thereof is available and potential inter-slice dependencies are resolved, cf. wavefront approach.

The different portions 12 may be entropy encoded into the entropy slices 90 using probability estimations which are set independently among the entropy slices, or using inter-entropy-slice adoption of probability estimates as described above such as, for example, namely in that the different portions 12 are encoded into the entropy slices 90 along respective entropy coding paths 14, and subordinate entropy slices have their corresponding portions 12 encoded therein using probabilities estimates derived, inter alias, from probability estimates used in higher ranking entropy slices at spatially neighboring parts of the corresponding portion, as described previously.

The entropy encoded data stream 20 may additionally comprise a header as is shown as an option in FIG. 16. The header 300 may be associated with the frame (sample array) of a sequence 30, the header 300 comprising information which reveals a length of the entropy slices. The information regarding the length of the entropy slices 90 may be coded within the header 300 as described above using VLC codes. Using the knowledge about the length of the entropy slices, at the decoding side, it is possible to identify a last chunk associated with each of the entropy slices 90 and the length thereof. However, startcodes or other indication schemes may also be used. The slice's start positions may be also identified just by the decoding process which knows the termination of a slice. Therefore it may be possible to just rely on the indication of the decoder, but this necessitates signaling between decoders and in some cases, if an "earlier" entropy slice terminates later than a "later" slice in the stream. This may necessitate for the specific cases an "adaptive" signaling in the stream, which may be based on startcodes.

For example, the entropy slices 90 may be arranged after the header 300 as illustrated in FIG. 16.

The chunks 310 may be of equal length, at least as far as a beginning contiguous portion of the sequence of chunks 310 from a first one of the chunks on along an order in which the chunks are arranged within the entropy encoded data stream 20, is concerned. Subsequent chunks may vary in length. The subsequent chunks may be equal to the length of the beginning contiguous portion of the sequence or smaller than this length. The length of the subsequent chunks may be derived from the aforementioned information within the header 300 revealing the length of the entropy slices 90 or the start position.

The chunks 310 may be arranged within the entropy encoded data stream 20 in a cyclic manner in accordance with an order defined among the entropy slices. For entropy slices, the chunks of which are completely within the previous cycles, may be skipped in the current and subsequent cycles.

Other information signals then a sample array sequence such as a video signal could by conveyed via data stream 20 as well. The different portions 12 need, thus, be no portions of a predetermined sample array such as a picture/frame.

As described above, the entropy slices 90 may have the different portions 12 of the sample array 10 encoded thereinto via predictive coding using inter-entropy-slice prediction and/or inter-frame prediction an entropy encoding of a prediction residual of the inter-entropy-slice prediction and/or inter-frame prediction. That is, as described above, the different portions may be spatially distinct portions of the frame 10 or multiple frames 30. Latter case applies, if the following frame's(s') slice(s) or entropy slice(s) can be already decoded, e.g. in wavefront manner, based on the knowledge that the necessitated information for decoding an entropy slice of a following frame due to the available inter-frame references. Those already decodable data of a frame succeeding in decoding order may be derived from the maximum allowed/signaled motion vector length or additional information in the stream indicating the dependencies of data parts to the preceding frame(s)), and inter-entropy-slice prediction may involve intra prediction, while inter-frame prediction may involve motion-compensated prediction. An example is outlined below.

The aforementioned independency of the probability estimation setting among the entropy slices, may relate to both probability adaptation as well as context modeling. That is, the context chosen within an entropy slice, may be chosen independently from other entropy slices, and the probability estimation of a context may be initialized and adapted independent from any other entropy slice as well.

An corresponding entropy decoder may be constructed as follows.

An entropy decoder configured to decode an entropy encoded data stream 20 which comprises entropy slices 90 into which different portions of a frame are entropy encoded, wherein the entropy slices are sub-divided into chunks 310 which are arranged within the entropy encoded data stream 20 in an interleaved manner, may be configured as shown in FIG. 6 and may additionally comprise a de-interleaver configured to de-interleave the chunks 310, symbolized with 314 in FIG. 16.

In particular, as illustrated in FIG. 5, the entropy decoder may comprise a plurality of entropy decoders 130 such as threads running on different processing kernels, wherein the de-interleaver may be configured to, for each entropy slice, forward the chunks 310 thereof to an entropy decoder 44 associated with the respective entropy slice.

In other words, the entropy slices may be sub-divided into chunks, which, in turn, may be interleaved, and the decoder may comprise a de-interleaver to de-interleave the chunks and may start operating on the entropy slices in parallel along the paths 16 even before the reception of any of the entropy slices as a whole. It should be recalled that the length of the chunks may be measured in the entropy encoded domain rather than in the syntax domain so as to correspond, for example, to a number of certain spatial parts/blocks in the picture or the like although the latter option would be available as well.

Next, possible usage of temporal dependencies is described. Same may be used in addition to, or alternatively to the probability estimation enhancement embodiments described so far.

Wavefront Processing pattern may, as it is described now, be extended to the entropy coding with the new probabilities calculation for each LCU to use also the temporal dependencies between frames.

Figure 17:
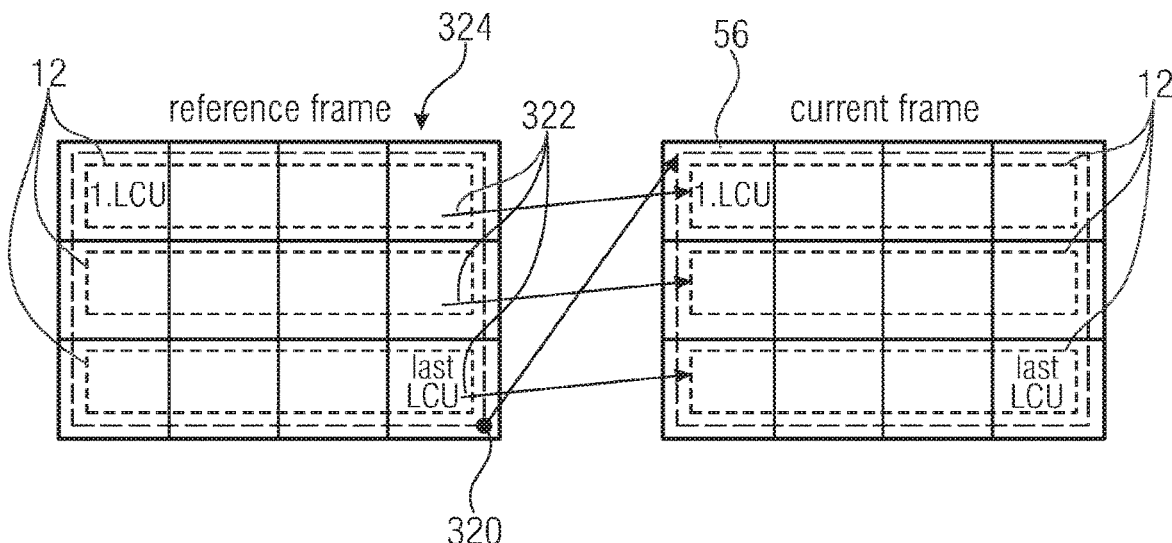
FIG. 17 schematically and exemplarily illustrates a possible compound between Frames.
Figure 18:
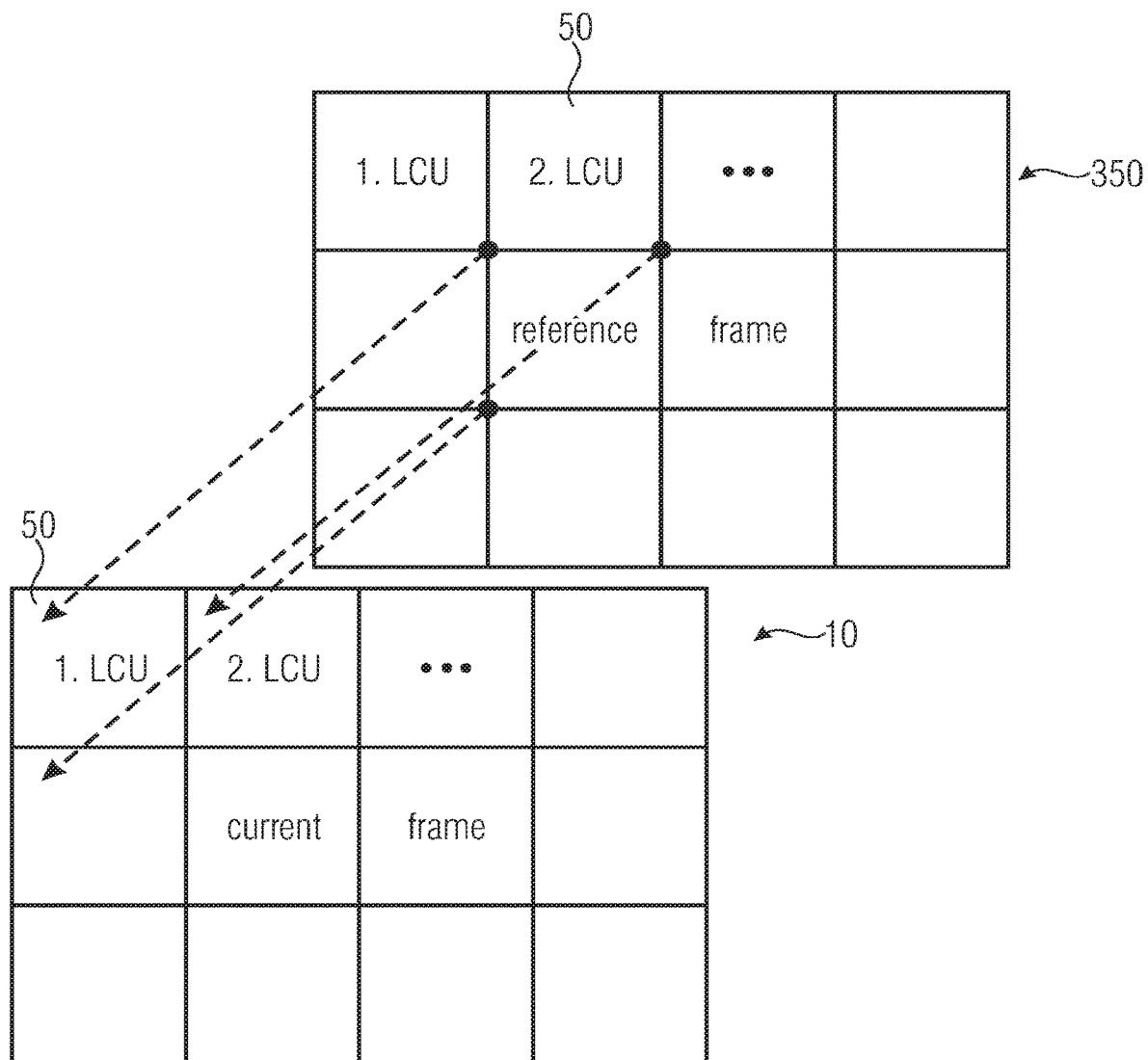
FIG. 18 schematically and exemplarily illustrates a possible usage of collocated information.

As well-known, the probabilities will be re-initialized at the beginning of each frame (the first LCU). Thereby the probabilities, which have already been acquired in the previous frame, are lost. In order to decrease the lose of coding efficiency, one may pass the end state of picture (cp. 320) or, in the case of entropy slice usage, end state of slice (cp. 322) of the probabilities from the reference frame 324 to the first LCU 50 of the current frame 10 or entropy slice 12 respectively (FIG. 17). Such data of a corresponding slice in a reference frame may be derived not only at the end position but also from at a prior position in the referenced slices, since the parallel wavefront processing may also go over frame boundaries, i.e. while coding a slice of a frame, the coding process of the slice of the preceding frame may not already be finished. Therefore, signaling may be used to indicate the reference position, or may be indicated by scheme.

Using above notation, one may thus, for initializing in starting phase 84 and 234, respectively, set $P_{\{i,j\}}$ with $\{i,j\}$ denoting the first CU 50 in the k-th entropy slice of the current sample array equal to, or at least depending on, any $T(P_{\{i,j\}'})$ with $\{i,j\}'$ denoting a CU within a preceding (in sample array coding order which may be equal to the presentation order) sample array or a combination of several $T(P_{\{i,j\}'})$'s. This may be done for k=0 only, or for each entropy slice k∈{1 . . . K} with K denoting the number of entropy slices in the current frame. The temporal initialization may be done additionally or alternatively to the spatial initialization described above. That is, $P_{\{i,j\}}$ with $\{i,j\}$ denoting the first CU 50 in the k-th entropy slice may be set equal to some combination (such as same average) of $T(P_{\{i,j\}'})$ and $T(P_{\{i,j\}spatial})$ with $\{i,j\}'$ denoting a CU within a preceding (previously de/coded) sample array or a combination of several $T(P_{\{i,j\}'})$'s and $\{i,j\}_{spatial}$ denoting a CU within a preceding entropy slice of the current sample array. As far as the location of $\{i,j\}'$ is concerned, $P_{\{i,j\}}$ with $\{i,j\}$ denoting the first (in entropy coding order 14) CU 50 in the k-th (in entropy coding order 14) entropy slice of the current sample array may be set equal to $T(P_{\{i,j\}'})$ with $\{i,j\}'$ denoting the last (in entropy coding order 14) CU within the k-th (in entropy slice order) entropy slice in the preceding (in sample array coding order) sample array or the last CU within the last (in entropy slice order) entropy slice in the preceding (in sample array coding order) sample array. Again, this temporal initialization may be performed for the first entropy slice in the sample array only.

The parsing process of the end state of the reference frame was tested with the method of probabilities adaptation, which results are illustrated on FIG. 10-FIG. 19 (Temporal graph).

Another opportunity to use the dates from other frames is to exchange the obtained probabilities between collocated LCUs. The main idea is based on assertion that properties of reference frame differ from current frame not greatly. In order to quicken the learning of the probabilities along LCUs in a frame, one can try to pass the end state of each LCU to the appropriate LCU in current frame. This proposal is illustrated on FIG. 18.

Under reference frame, different opportunities can be understood. As for instance, a frame, which is the last coded can be used as a reference frame. Otherwise the last coded frame only from the same temporal layer can be appropriated for reference.

Moreover, this approach can be merged with already above proposed methods, as usage of last (slice) information from reference frame, probabilities adaptation and usage of the second LCU of the upper line.

The above spatial adaptation process may be modified to be $$P_{p(n+1)} = \text{average}(T(P_{p(n)}), T(P_{\{i,j\}'1}), \ldots, T(P_{\{i,j\}'N}), T(P_{\{i,j\}'1}), \ldots, T(P_{\{i,j\}'M}),)$$

where N may be 1 or more than 1 and $\{i,j\}_1 \ldots N$ is/are selected from (lie within) any previous (in entropy slice order 16) entropy slice 90 in the current sample array 10 and its associated portion 12, respectively, and M may be 1 or more than 1 and $\{i,j\}'_1 \ldots M$ is/are lie within the preceding sample array 350. It may be that (the) at least one of CU's 50 $\{i,j\}'_1 \ldots M$ is co-located to p(n). With regard to possible selections of CU's 50 $\{i,j\}_1 \ldots N$ reference is made to the above description. The function "average" may be one of a weighted sum, a median function, etc.

The above spatial adaptation process may be replaced by $$P_{p(n+1)} = \text{average}(T(P_{p(n)}), T(P_{\{i,j\}'1}), \ldots, T(P_{\{i,j\}'M}),)$$

where M may be 1 or more than 1 and $\{i,j\}'_1 \ldots M$ is/are lie within the preceding sample array. It may be that (the) at least of $\{i,j\}'_1 \ldots M$ is co-located to p(n). With regard to possible selections of $\{i,j\}_1 \ldots N$ reference is made to the above description. The function "average" may be one of a weighted sum, a median function, etc. It may be that (the) at least of $\{i,j\}'_1 \ldots M$ is co-located to p(n).

As a specific extension of usage of collocated information, an approach to utilize the obtained dates from other blocks from one or even more reference frames can be applied.

Earlier mentioned techniques use only the obtained information from the direct neighbors in current frame or in reference frames. However it does not mean that the gained probabilities in this case are the best ones. The adjacent LCUs, according to the picture partitions (residuals), do not have the best probabilities models. It is supposed that the best results can be achieved with the help of blocks, from which prediction will be done. And thus, this appropriate block can be used as a reference for the current LCU.

Thus, in the above adaptation example, $\{i,j\}_1 \ldots N$ and/or $\{i,j\}'_1 \ldots M$ may be selected depending on CU's serving as providers of predictors for p(n).

The temporal probability adaptation/initialization schemes presented can also be used without entropy slices or a single entropy slice per frame.

In accordance with the latter aspect, a gain in probability adaptation speed is achieved by coupling the probability adaptations of temporally neighboring/related frames. What it is described there is, a decoder such as the one of FIG. 6, wherein the decoder is configured to reconstruct a sequence of sample arrays from an entropy encoder data stream, and is configured to entropy decode a current frame of the entropy encoder data stream so as to reconstruct a current sample array of the sequence of sample arrays, perform the entropy decoding along an entropy coding path and using probability estimations and adapt the probability estimations along the entropy coding path using a previously decoded part of the current frame, wherein the entropy decoding stage is configured to initialize or determine the probability estimations for the current frame based on probability estimations used in decoding a previously decoded frame of the entropy encoded data stream.

That is, for example, the probability estimations for the current frame are initialized based on probability estimations resulting after having finished decoding the previously decoded frame of the entropy encoded data stream. Buffer requirements are, therefore low, since merely the end state of the probability estimates have to be buffered till the start of the decoding of the current frame. Of course, this aspect is combinable with the aspect of FIGS. 1 to 9 in that for the first parts of each portion 12 not only probability estimates used for spatially neighboring parts in prior entropy slices (if available) but also, in a weighted manner, for example, the end state of the probability estimates of a (for example, spatially) corresponding entropy slice in the previous frame is used. Such data of a corresponding slice in a reference frame may be derived not only at the end position but also from a prior position in the referenced slices, since the parallel wavefront processing may also go over frame boundaries, i.e. while coding a slice of a frame, the coding process of the slice of the preceding frame may not already be finished. Therefore, signaling may be used to indicate the reference position, or may be indicated by scheme.

Further, for example, the probability estimations used for coding the parts/blocks of the previously decoded frame are buffered all, not only the end state, and the decoder would, in entropy decoding the predetermined entropy slice (with reference to above description of spatially couple probability derivation), perform entropy decoding the current part (X) of the predetermined entropy slice based on the respective probability estimations of the predetermined entropy slice as adapted using the previously decoded part of the predetermined entropy slice (including p1, for example), and probability estimations as used in the entropy decoding of a spatially corresponding part of an entropy slice of the previously decoded frame with, optionally, additionally using probability estimations as used in the entropy decoding of a spatially neighboring, in entropy slice order preceding entropy slice (the slice comprising X, for example) at a neighboring part (such as p4) of the spatially neighboring entropy slice, as described above. As has also been described above, the spatial correspondence among parts, and the identification of an appropriate one for probability adoption for the current frame among the previously decoded frame may be defined by help of motion information such as, motion indices, motion vectors and the like, of the current part/block.

Figure 19:
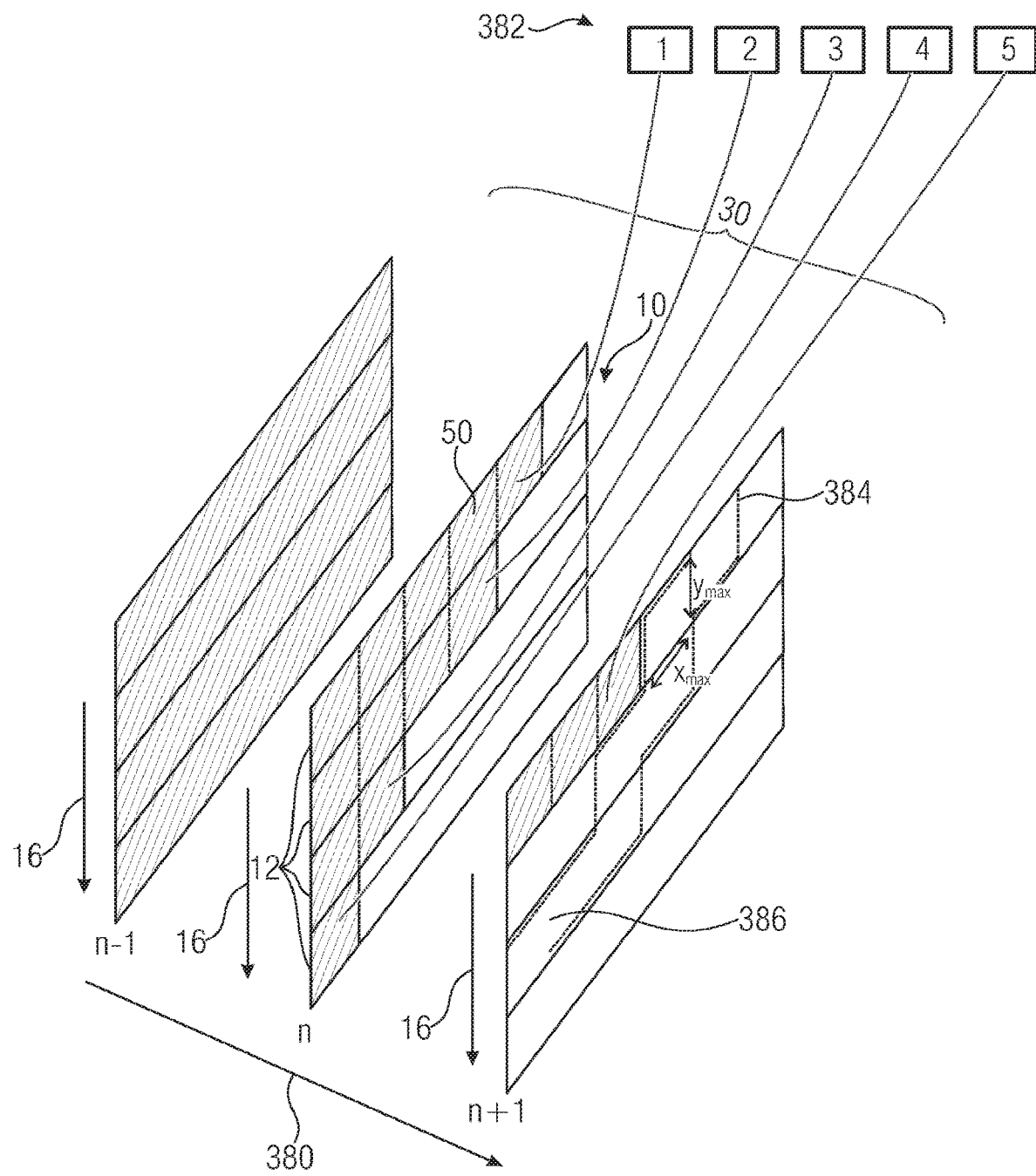
FIG. 19 schematically shows the possibility of a wavefront running obliquely within the spatio/temporal space spanned by consecutive sample arrays.

Up to now, the wavefront extending during wavefront processing has primarily been described as extending obliquely through one sample array 10 with the coding/decoding being performed one sample array after the other. However, this is not a must. Reference is made to FIG. 19. FIG. 19 shows a portion out of a sequence of sample arrays, wherein the sample arrays of the sequence have defined thereamong, and are depicted as being arranged in, a sample array coding order 380 which may or may not coincide with a presentation time order. FIG. 19 exemplarily shows a subdivision of the sample arrays 10 into four entropy slices each. Already coded/decoded entropy slices are shown hatched. Four coding/decoding threads (coding/decoding stages) 382 are currently operating on the four entropy slices 12 of sample array having index n. However, FIG. 19 shows a thread number 5 being left, and it is possible that this further thread 382 having number 5 in FIG. 19 operates to code/decode the next sample array in line, i.e. n+1, at portions for which it is guaranteed that respective reference portions in currently coded/decoded frame n are already available, i.e. have already been processed by any of threads 1 to 4. These portions are referenced in predictions shown at 64 in FIG. 1, for example.

FIG. 19 exemplarily shows with a dotted line 384, a line extending through sample array n+1 which is co-located to the border between the already processed, i.e. already coded/decoded portion of sample array n, i.e. the hatched portion within sample array n on the one hand, and the non yet processed portion, i.e. the un-hatched portion of sample array n on the other hand. With double headed arrows, FIG. 19 also shows the maximum possible length of motion vectors measured in column and row direction, i.e. $y_{max}$ and $x_{max}$, respectively. Accordingly, FIG. 19 also shows with a dash-dotted line 386 a displaced version of line 384, namely a line 386 which is spaced apart from line 384 at the minimum possible distance so that the distance does not fall below $y_{max}$ in column direction and $x_{max}$ in row direction. As can be seen, there are coding units 50 in sample array n+1 for which any reference portion in sample array n is guaranteed to be found as being completely contained within the already processed portion of this sample array n, namely those laying in the half of sample array n+1 lying on the upstream side relative to line 386. Accordingly, thread 5 is able to already operate to decode/code these coding units as shown in FIG. 19. As can be seen, even a sixth thread could operate on the second entropy slice in entropy slice order 16 of sample array n+1. Thereby, the wavefront extends not only spatially but also temporally through the spatio-temporal space spanned by the sequence 30 of sample arrays.

Please note that the just-mentioned wavefront aspect does also work in combination with the above-outlined probability estimation couplings across entropy slice boarders.

Further, with respect to the above outlined chunk aspect, it should also be noted that subdividing entropy slices into smaller pieces, i.e. chunks, is not restricted to being performed in the entropy coded domain, i.e. in the entropy compressed domain. Think of the above discussion: entropy slices as described above have the advantage of reducing the coding efficiency loss despite the enablement of wavefront processing due to the derivation of probability estimations from previously coded/decoded entropy slices of the same or a previously coded/decoded frame, i.e. an initialization and/or adaptation of the probability estimations based on probability estimations of such previous entropy slices. Each of these entropy slices is supposed to be entropy coded/decoded by one thread in case of wavefront processing. That is, when subdividing the entropy slices, it is not necessary to render the chunks codable/decodable in parallel. Rather, the encoder shall merely be provided with the opportunity to output subparts of its entropy slice's bitstream prior to finalizing the entropy encoding, and the decoder shall be provided with the opportunity to operate on these subparts, i.e. chunks, prior to the reception of the remaining chunks of the same entropy slice. Moreover, the interleaving shall be enabled at the reception side. In order to enable the latter de-interleaving, however, it is not necessary to perform the subdivision in the entropy coded domain. In particular, it is possible to perform the above presented subdivision of entropy slices into smaller chunks without severe coding efficiency loss, by intermittently merely resetting the internal state of the probability interval, i.e. the probability interval width value, and the offset value, respectively, of the entropy coding/decoding core. The probability estimations, however, are not reset. Rather, they are continuously updated/adapted from the beginning to the end of the entropy slices, respectively. By this measure, it is possible to subdivide the entropy slices into individual chunks with the subdivision being performed in the syntax element domain rather than the compressed bitstream domain. The subdivision may follow a spatial sub-division as outlined below in order to ease a signaling of the chunk interfaces to the decoder. Each of the chunks could be provided with its own chunk header revealing, for example, its starting position in the sample array, measured, for example, with respect to the coding order 14 relative to the respective entropy slice's start position along with an index to its entropy slice, or relative to a prominent location of the sample array 10 such as the upper left corner.

Figure 20:
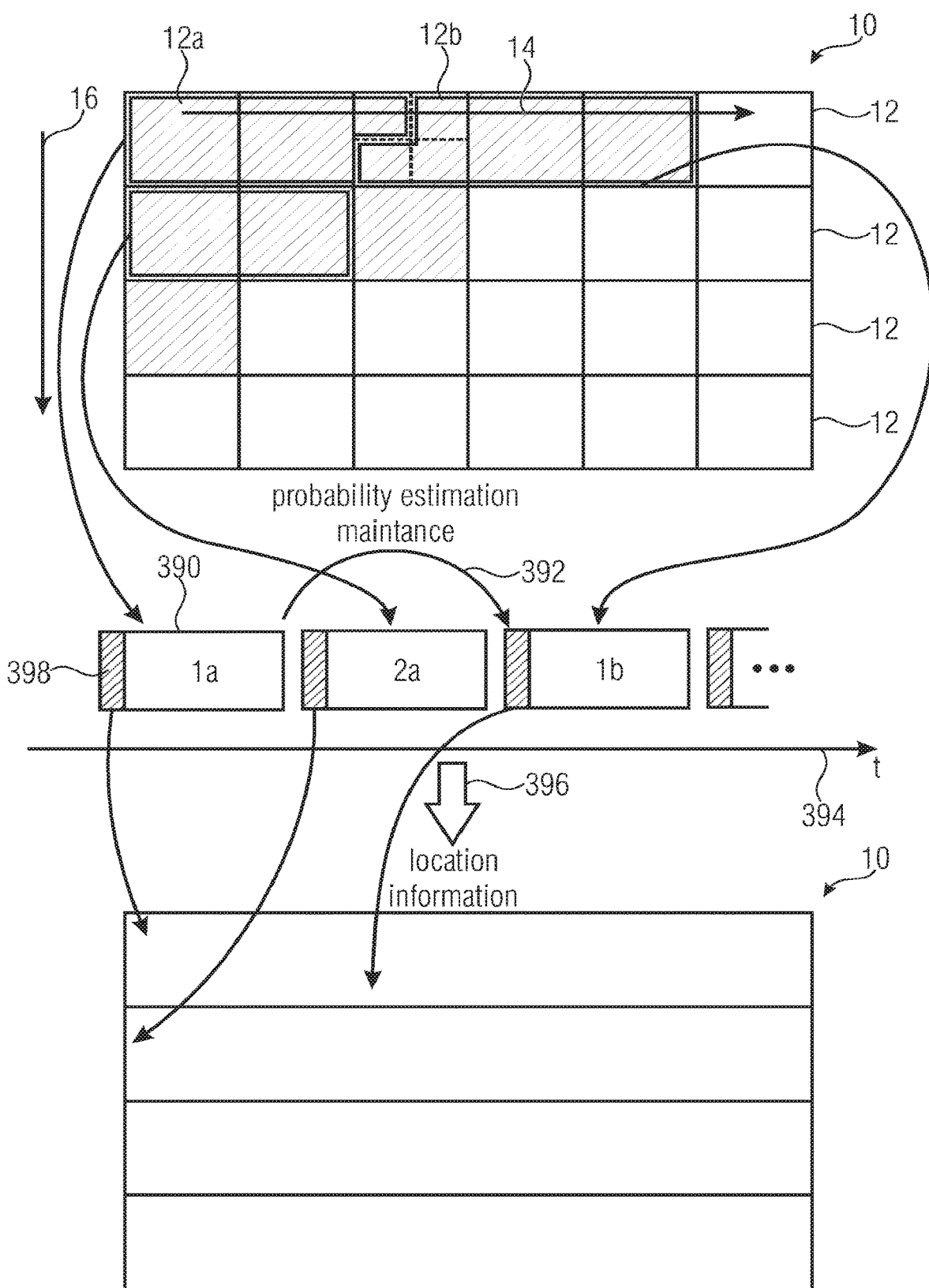
FIG. 20 schematically shows another example for subdividing entropy slices into chunks.

In order to more clearly describe the subdivision of entropy slices into chunks in accordance with the latter embodiment, reference is made to FIG. 20. FIG. 20 shows, merely for illustrative purposes, sample array 10 as being subdivided into four entropy slices. Currently coded portions of sample array 10 are shown hatched. Three threads are currently operating on the entropy encoding of sample array 10 and output chunks of the entropy slices on an immediate-attention basis: see for example the first entropy slice in entropy slice order 16 which corresponds to portion 12 of sample array 10. After having encoded a subpart 12a of portion 12, the encoder forms a chunk 390 therefrom, i.e. the entropy coding core 80 performs some finishing procedure to finalize the arithmetic bitstream produced from sub-portion 12a so far in case of arithmetic coding to form chunk 390. The encoding procedure is then resumed with respect to the subsequent sub-portion 12b of entropy slice 12 in coding order 14 while starting a new entropy bitstream. This means, for example, that internal states, such as probability interval width value and probability interval offset value of entropy coding core 80, are reset. The probability estimations, however, are not reset. They are left unchanged. This is illustrated in FIG. 20 by an arrow 392. In FIG. 20, it is exemplarily shown that the entropy slice or portion 12 is subdivided into more than two sub-portions, and accordingly even the second chunk 1b is subject to some entropy finishing before reaching the end of portion 12 along coding order 14, whereupon a next chunk in line is started with etc.

Concurrently, another thread operates on the second entropy slice or portion 12 in entropy slice order 16. Upon finishing a first sub-portion of this second entropy slice/portion 12, a chunk 2a is output, whereupon entropy coding the remainder of the second entropy slice is commenced while maintaining, however, the probability estimation as valid at the end of chunk 2a.

With a time axis 394, FIG. 20 seeks to illustrate that the chunks 390 are output as soon as they have been finalized. This leads to an interleaving similar to the one depicted in FIG. 16. Each chunk may be packetized into a packet and transported to the decoding side via some transport layer in any order. The transport layer is illustrated using arrow 396.

The decoder has to reassign the chunks to its sub-portions 12a, 12b and so forth. To this end, each chunk 390 may have a header section 398 revealing the location of the beginning of its associated sub-portion 12a or 12b, i.e. the sub-portion the syntax elements describing the same are entropy coded in the respective chunk. By using this information, the decoder is able to associate each chunk 390 with its entropy slice and with its sub-portion within the portion 12 of that entropy slice.

For illustration purposes, FIG. 20 also exemplarily shows the possibility that the junction between consecutive sub-portions 12a and 12b of an entropy slice 12 does not have to coincide with the border between consecutive coding units 50. Rather, the junction may be defined in a deeper level of the aforementioned exemplary multi-tree subdivision of the coding units. The location information contained in headers 398 may indicate the beginning of the sub-portion associated with the current chunk 390 precisely enough in order to identify the respective sub-block of the respective coding unit, i.e. the location within the syntax element sequence from which on the respective sub-block is described.

As became clear from the above discussion, almost no coding efficiency loss resulted from the subdivision of the entropy slices into chunks. Merely the entropy finishing processes and the packetizing may involve some coding efficiency loss, but on the other hand low delay gains are enormous.

Again, please note that the just-mentioned spatial sub-division chunk aspect does also work in combination with the above-outlined probability estimation couplings across entropy slice boarders, spatially and temporally.

The decoder such as decoder of FIG. 6, may undo the chunk transmission as follows. IN particular, the decoder may check as to which entropy slice a current chunk belongs to. This check may be done based on the afore-mentioned location information. Then, it may be checked whether the current chunk corresponds to a first sub-portion of the portion of the corresponding entropy slice along the entropy coding path 14. If so, the decoder may entropy decode the current chunk under adapting the respective probability estimations and take a state of the respective probability estimations as manifesting themselves at an end of entropy decoding the current chunk into account when entropy decoding another chunk which corresponds to a second sub-portion of the portion of the predetermined entropy slice along the entropy coding path. The "taking into account" may involve setting the probability estimations at the beginning of chunk 1b equal to the probability estimations manifesting themselves, by the probability adaption starting from the probability estimation state at the beginning of chunk 1a, at the end of chunk's 1a sub-portion 12a, or equal to a combination thereof with entropy probability estimations from other entropy slices as described above. As far as the probability initialization at the beginning of the first chunk 12a is concerned, reference is made to the above discussion, as this also forms the beginning of the corresponding entropy slice. In other words, if the current slice is a second or following chunk in order 14, decoder may entropy decode the current chunk using probability estimations which depend on probability estimations manifesting themselves at an end of entropy decoding a chunk which corresponds to a sub-portion of the portion of the predetermined entropy slice preceding the sub-portion corresponding to the current chunk, along the entropy coding path 14.

The above description reveals different methods, which can be useful for parallel encoding and decoding as well as helpful for optimization of already existing processes in the emerging HEVC video coding standard. A short overview of entropy slices has been presented. It has been shown how they can be formed, which advantages can be achieved by slicing and what penalties can occur from those techniques. A number of methods have been proposed, which are supposed to improve the learning process of probabilities along LCUs (largest coding unit) in frame, by better exploiting the local dependences between LCUs, and also the temporal dependences between LCUs of different frames. It is asserted that different combinations provide improvements for both concepts with and without parallelization of encoding and decoding.

The performance improvement in High Efficiency, for instance, by the best mix of proposed approaches, is −0.4% in Intra, −0.78% in Low Delay and −0.63% in Random Access in comparison with HM3.0 without use of entropy slices or −0.7% in Intra, −1.95% in Low Delay and −1.5% in Random Access in comparison with entropy slice approach with usual re-initialization.

In particular, inter alias, the following techniques have been presented above. [0166] to use not only local but also temporal dependencies of LCUs, to optimize adaptation of the CABAC probabilities before coding each LCU, see FIGS. 1 to 9, 17 and 18. [0167] to achieve more flexibility in decoding, also entropy slices can be utilized, so that certain regions in frame become independent from each other. [0168] to allow minimal signaling of the slice/entropy slices start positions for parallelized, e.g. wavefront processing, see FIG. 15 to allow low delay transport in an parallelized encoder-transmitter-receiver-decoder environment through interleaved transport of entropy slices/slices, see FIG. 16.

All the methods, which were mentioned above, have been integrated and tested in HM3.0.

The obtained results, where reference point is HM3.0 without any entropy slice implementation, are presented in tables 1 and 2 (where 2LCU—usage of the second LCU of the upper line; 2LCU+Prob.Adap-2LCU merged with the method of probabilities adaptation; Temporal—usage of temporal dependences (end state of a reference frame) with the probabilities adaptation for each LCU).

TABLE 1

Summary RD results with 1 Thread

| 1Thread | 2LCU | 2LCU + Prob.Adap | Prob.Adap | Temporal |
|---|---|---|---|---|
| Intra | 0.14 | −0.31 | −0.4 | |
| LowDelay | 0.66 | 0.09 | −0.12 | −0.78 |
| Random | 0.48 | −0.1 | −0.24 | −0.63 |

TABLE 2

Summary RD results with 4 Threads

| 4 Threads | 2LCU | 2LCU + Prob.Adap | Prob.Adap | Temporal |
|---|---|---|---|---|
| Intra | 0.19 | −0.27 | −0.27 | |
| LowDelay | 1.01 | 0.54 | 0.63 | 0.17 |
| Random | 0.74 | 0.2 | 0.24 | 0.01 |

However, it is interesting to know how the proposed approaches affect the wavefront processing with the re-initialization of probabilities at the beginning of each line of LCUs. These results are illustrated on tables 3 and 4 (where orig_neiInit is comparison HM3.0 without use of entropy slices with usage of entropy slices with re-initialization).

TABLE 3

Summary RD results with1 Thread. Reference is new initialization.

| 1Thread | orig_neiInit | 2LCU | 2LCU + ProbAdap | ProbAdapt | Temporal |
|---|---|---|---|---|---|
| Intra | 0.3 | −0.15 | −0.62 | −0.7 | |
| RandomAccess | 0.9 | −0.4 | −0.99 | −1.13 | −1.51 |
| LowDelay | 1.19 | −0.51 | −1.08 | −1.29 | −1.95 |

TABLE 4

Summary RD results with 4 Threads. Reference is new initialization.

| 4Threads | orig_neiInit | 2LCU | 2LCU + ProbAdap | ProbAdapt | Temporal |
|---|---|---|---|---|---|
| Intra | 0.34 | −0.14 | −0.61 | −0.61 | |
| RandomAccess | 1.18 | −0.43 | −0.96 | −0.96 | −1.15 |
| LowDelay | 1.61 | −0.5 | −0.92 | −1.05 | −1.41 |

The above results show that considerably more use of dependences within and between frames and rational application of already obtained information prevent average loss.

An approach for Wavefront Processing for HEVC video encoding and decoding merges the possibility to use dependences between adjacent LCUs as well as temporal frame dependences with the concept of Wavefront Parallel Processing. In this way the loss can be reduced and the performance advance can be achieved.

A gain in probability adaptation speed has been achieved by computing the probability adaptations of spatially neighboring entropy slices.

As already mentioned above, all of the above aspects may be combined with each other, and thus, the mentioning of certain implementation possibilities with regard to a certain aspect shall, of course, also apply to the other aspects.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The inventive encoded signals mentioned above can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A decoder for reconstructing a sample array of a video from an entropy-encoded data stream, the decoder comprising:
    an entropy decoder configured for entropy decoding a plurality of entropy slices in the data stream to reconstruct different portions of the sample array of the video,
    wherein, for entropy decoding a current entropy slice of the plurality of entropy slices, the entropy decoder is configured for:
    decoding a position difference value of the current entropy slice using Exponential-Golomb coding, wherein the position difference value indicates a difference between a starting position of a preceding entropy slice and a starting position of the current entropy slice, the current and preceding entropy slices corresponding to consecutive rows of the sample array, and
    deriving the starting position of the current entropy slice within the data stream based on a sum of the starting position of the preceding entropy slice and the position difference value, wherein entropy decoding of the preceding entropy slice precedes entropy decoding of the current entropy slice.

2. The decoder of claim 1, wherein the entropy decoding of the preceding entropy slice immediately precedes the entropy decoding of the current entropy slice, such that no other entropy slice is entropy decoded between the entropy decoding of the current and preceding entropy slices.

3. The decoder of claim 1, wherein the Exponential-Golomb coding provides a prefix bin string and a suffix bin string related to the position difference value, and the prefix bin string identifies one of a plurality of value ranges to which the position difference value belongs.

4. The decoder of claim 1, wherein each row of the sample array has a same number of blocks of the sample array, and each of the plurality of entropy slices comprising entropy-encoded data for a corresponding row of the sample array.

5. The decoder of claim 1, wherein the entropy decoder is configured for performing, for each entropy slice, entropy decoding along a respective entropy coding path leading in parallel along rows of the sample array.

6. The decoder of claim 5, wherein the entropy decoder is configured for entropy-decoding the plurality of entropy slices in a slice subset order, the slice subset order is chosen such that, along the slice subset order, the different portions follow each other in a direction angled relative to the entropy coding paths of the entropy slices.

7. The decoder of claim 5, wherein the entropy slices are sub-divided into chunks, and the decoder further comprises a de-interleaver to de-interleave the chunks and the entropy decoder is configured for starting the entropy decoding of the entropy slices in parallel along the entropy coding paths even before a reception of any of the entropy slices as a whole.

8. The decoder of claim 1, wherein the sample array is a current sample array of a sequence of sample arrays and the entropy decoder is configured for entropy-decoding an entropy slice using a first probability estimation based on a previously-decoded part of that entropy slice, and a second probability estimation obtained in entropy decoding a previously-decoded frame relating to one of the sample arrays other than the current sample array.

9. The decoder of claim 1, wherein the decoder is at least a portion of a programmable logic device, programmable gate array, microprocessor, computer or hardware apparatus.

10. A method for reconstructing a sample array of a video from an entropy-encoded data stream, the method comprising:
    entropy decoding a plurality of entropy slices in the data stream to reconstruct different portions of the sample array of the video,
    wherein, for entropy decoding a current entropy slice of the plurality of entropy slices, the entropy decoding includes:
    decoding a position difference value of the current entropy slice using Exponential-Golomb coding, wherein the position difference value indicates a difference between a starting position of a preceding entropy slice and a starting position of the current entropy slice, the current and preceding entropy slices corresponding to consecutive rows of the sample array, and
    deriving the starting position of the current entropy slice within the data stream based on a sum of the starting position of the preceding entropy slice and the position difference value, wherein entropy decoding of the preceding entropy slice precedes entropy decoding of the current entropy slice.

11. The method of claim 10, wherein the entropy decoding of the preceding entropy slice immediately precedes the entropy decoding of the current entropy slice, such that no other entropy slice is entropy decoded between the entropy decoding of the current and preceding entropy slices.

12. The method of claim 10, wherein the Exponential-Golomb coding provides a prefix bin string and a suffix bin string related to the position difference value, and the prefix bin string identifies one of a plurality of value ranges to which the position difference value belongs.

13. The method of claim 10, wherein each row of the sample array has a same number of blocks of the sample array, and each of the plurality of entropy slices comprising entropy-encoded data for a corresponding row of the sample array.

14. The method of claim 10, wherein the entropy-decoding of each of the plurality of entropy slices is performed along a respective entropy coding path leading in parallel along rows of the sample array.

15. The method of claim 14, wherein the entropy slices are sub-divided into chunks, and the method further comprises de-interleaving the chunks and starting the entropy decoding of the entropy slices in parallel along the entropy coding paths even before a reception of any of the entropy slices as a whole.

16. The method of claim 14, wherein the entropy-decoding of the plurality of entropy slices is performed in a slice subset order, the slice subset order is chosen such that, along the slice subset order, the different portions follow each other in a direction angled relative to the entropy coding paths of the entropy slices.

17. The method of claim 10, wherein the sample array is a current sample array of a sequence of sample arrays and the entropy-decoding an entropy slice uses a first probability estimation based on a previously-decoded part of the entropy slice, and a second probability estimation obtained in entropy decoding a previously-decoded frame relating to one of the sample arrays other than the current sample array.

18. A method for encoding a sample array of a video into an entropy-encoded data stream, the method comprising:
    entropy encoding a plurality of entropy slices into the entropy-encoded data stream, wherein
    the entropy encoding includes encoding into the data stream, for a current entropy slice of the plurality of entropy slices, using Exponential-Golomb coding, a position difference value related to a starting position within the data stream of the current entropy slice, the position difference value indicating a difference between a starting position of a preceding entropy slice and the starting position of the current entropy slice, wherein the current and preceding entropy slices correspond to consecutive rows of the sample array,
    the starting position of the current entropy slice within the data stream is to be derived based on a sum of the starting position of the preceding entropy slice and the position difference value, and
    entropy encoding of the preceding entropy slice precedes entropy encoding of the current entropy slice.

19. The method of claim 18, wherein the entropy encoding of the preceding entropy slice immediately precedes the entropy encoding of the current entropy slice, such that no other entropy slice is entropy encoded between the entropy encoding of the current and preceding entropy slices.

20. The method of claim 18, wherein the Exponential-Golomb coding provides a prefix bin string and a suffix bin string related to the position difference value, and the prefix bin string identifies one of a plurality of value ranges to which the position difference value belongs.

21. The method of claim 18, wherein each row of the sample array has a same number of blocks of the sample array, and each of the plurality of entropy slices comprising entropy-encoded data for a corresponding row of the sample array.

22. The method of claim 18, wherein the entropy encoding of each of the plurality of entropy slices is performed along a respective entropy coding path leading in parallel along rows of the sample array.

23. The method of claim 22, wherein the entropy slices are sub-divided into chunks, and the method further comprises interleaving the chunks into the data stream.

24. The method of claim 22, wherein the entropy encoding of the plurality of entropy slices is performed in a slice subset order, the slice subset order is chosen such that, along the slice subset order, the different portions follow each other in a direction angled relative to the entropy coding paths of the entropy slices.

25. The method of claim 18, wherein the sample array is a current sample array of a sequence of sample arrays and the entropy encoding an entropy slice uses a first probability estimation based on a previously-encoded part of the entropy slice, and a second probability estimation obtained in entropy encoding a previously-encoded frame relating to one of the sample arrays other than the current sample array.

26. A non-transitory computer-readable medium for storing data associated with a video, comprising:
    a data stream stored in the non-transitory computer-readable medium, the data stream comprising entropy-encoded information associated with a sample array of a video, the entropy-encoded information including a plurality of entropy slices, wherein entropy encoding of the sample array includes encoding into the data stream, for a current entropy slice of the plurality of entropy slices, using Exponential-Golomb coding, a position difference value related to a starting position within the data stream of the current entropy slice, the position difference value indicating a difference between a starting position of a preceding entropy slice and the starting position of the current entropy slice, the current and preceding entropy slices corresponding to consecutive rows of the sample array, the starting position of the current entropy slice within the data stream is to be derived based on a sum of the starting position of the preceding entropy slice and the position difference value, and entropy encoding of the preceding entropy slice precedes entropy encoding of the current entropy slice.

27. The non-transitory computer-readable medium of claim 26, wherein the Exponential-Golomb coding provides a prefix bin string and a suffix bin string related to the position difference value, and the prefix bin string identifies one of a plurality of value ranges to which the position difference value belongs.

28. The non-transitory computer-readable medium of claim 26, wherein each row of the sample array has a same number of blocks of the sample array, and each of the plurality of entropy slices comprising entropy-encoded data for a corresponding row of the sample array.

29. The non-transitory computer-readable medium of claim 26, wherein the entropy encoding of each of the plurality of entropy slices is performed along a respective entropy coding path leading in parallel along rows of the sample array.

30. The non-transitory computer-readable medium of claim 26, wherein the sample array is a current sample array of a sequence of sample arrays and the entropy encoding an entropy slice uses a first probability estimation based on a previously-encoded part of the entropy slice, and a second probability estimation obtained in entropy encoding a previously-encoded frame relating to one of the sample arrays other than the current sample array.

* * * * *